United States Patent
Matsumoto et al.

(10) Patent No.: US 6,876,002 B2
(45) Date of Patent: Apr. 5, 2005

(54) SEMICONDUCTOR LASER DEVICE AND METHOD FOR MANUFACTURING THE SAME

(75) Inventors: Mitsuhiro Matsumoto, Kashihara (JP); Fumihiro Konushi, Nara (JP); Shinichi Kawato, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 221 days.

(21) Appl. No.: 10/129,549

(22) PCT Filed: Jul. 3, 2001

(86) PCT No.: PCT/JP01/05744
§ 371 (c)(1),
(2), (4) Date: May 8, 2002

(87) PCT Pub. No.: WO02/23685
PCT Pub. Date: Mar. 21, 2002

(65) Prior Publication Data
US 2002/0163949 A1 Nov. 7, 2002

(30) Foreign Application Priority Data
Sep. 13, 2000 (JP) .......................................... 2000-277449

(51) Int. Cl.[7] .................................................. H01I 27/15
(52) U.S. Cl. ............................. 257/79; 257/82; 257/86; 257/87; 257/94; 257/95; 257/96; 257/97; 257/103
(58) Field of Search ................................. 257/79–103

(56) References Cited

U.S. PATENT DOCUMENTS

| | | | |
|---|---|---|---|
| 5,469,457 A | 11/1995 | Nagai et al. | |
| 5,577,063 A | 11/1996 | Nagai et al. | |
| 5,764,669 A | 6/1998 | Nagai | |
| 6,005,881 A | * 12/1999 | Ikoma | 372/46 |
| 6,323,507 B1 | * 11/2001 | Yokoyama et al. | 257/79 |

FOREIGN PATENT DOCUMENTS

| | | |
|---|---|---|
| CN | 1093836 | 10/1994 |
| JP | 4103187 | 4/1992 |

(Continued)

OTHER PUBLICATIONS

J.D. Ralston, S. O'Brien, G. W. Wicks, and L. F. Eastman, Room–Temperature exciton transitions in partially intermixed GaAs/AlGaAs superlattices, Appl. Phys. Lett. 52 (18), May 2, 1988, pp. 1511–1513.

Primary Examiner—Hoai Pham
Assistant Examiner—Wai-Sing Louie
(74) Attorney, Agent, or Firm—Morrison & Foerster LLP

(57) ABSTRACT

A semiconductor laser element includes, on a substrate, at least a first conductive type first clad layer, an active layer, a second conductive type second clad layer, a current block layer having a stripe-shaped deficient portion extending in a direction of a resonator, a second conductive type third clad layer buried in the stripe-shaped deficient portion of the current block layer and a second conductive type protection layer provided on the third clad layer. The active layer includes at least a window region adjacent to its one end surface and an internal region having a quantum well structure, and a portion opposite to the internal region is irradiated with an ionized atom from a surface of a layer arranged on the second conductive type second clad layer side and thereafter subjected to heat treatment to form the window region. A peak wavelength λw of photoluminescence from the window region of the active layer has a relation of:

$$\lambda w \leq \lambda i - 5 \text{ nm}$$

with respect to a peak wavelength λi of photoluminescence from the internal region of the active layer, and a half-width of the photoluminescence from the window region is narrower than a half-width of the photoluminescence from the internal region.

7 Claims, 15 Drawing Sheets

FOREIGN PATENT DOCUMENTS

| | | |
|---|---|---|
| JP | 05-167186 | 7/1993 |
| JP | 08-111560 | 4/1996 |
| JP | 9-23037 | 1/1997 |
| JP | 10-200190 | 7/1998 |
| JP | 018030963 | 9/2000 |
| JP | 2001-057459 | 2/2001 |

* cited by examiner

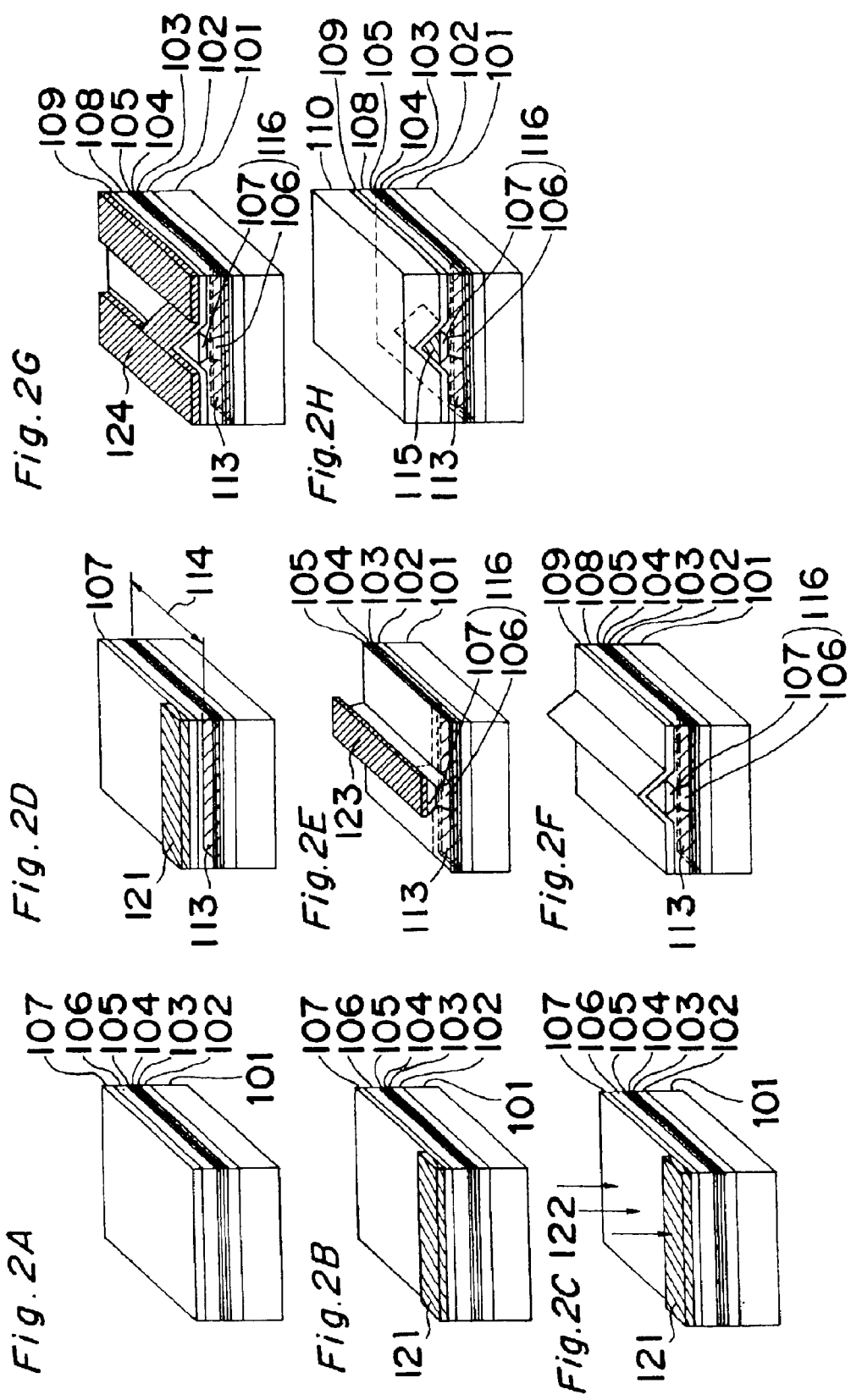

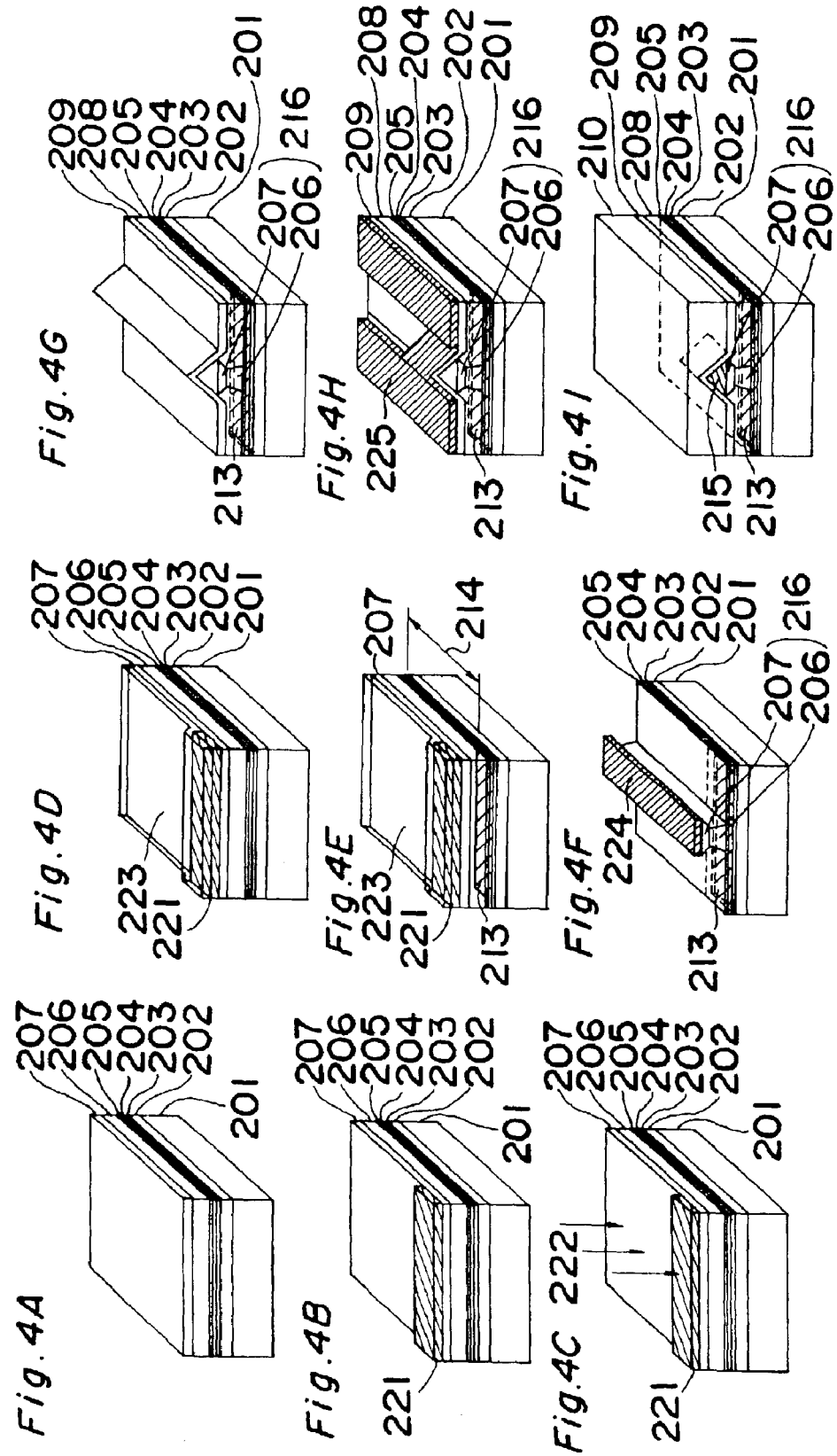

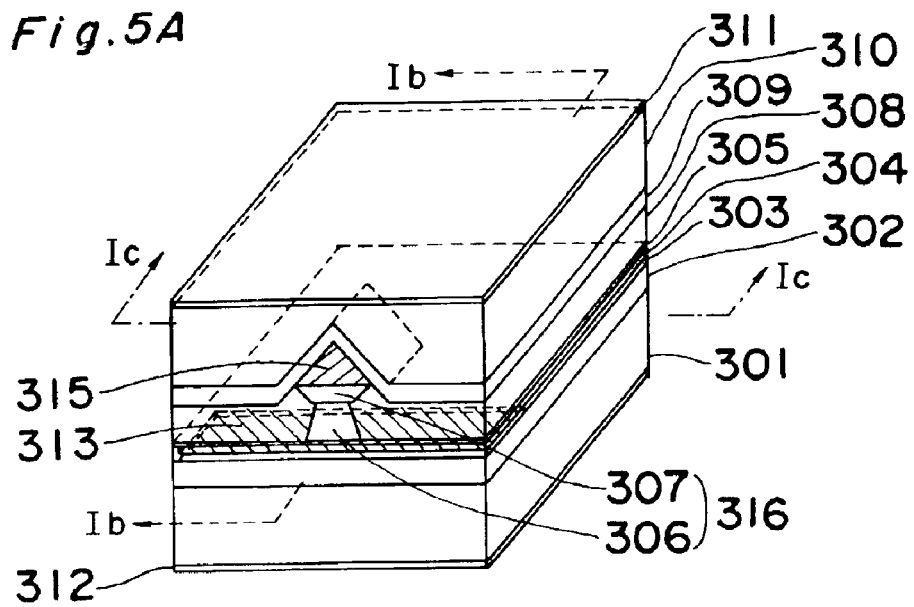
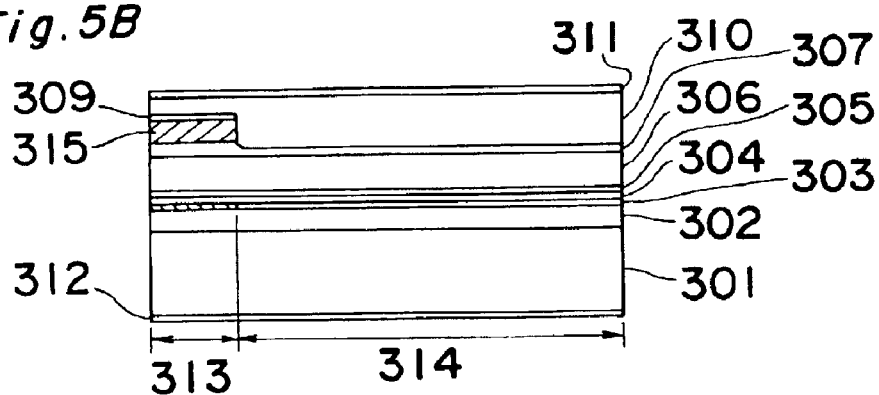
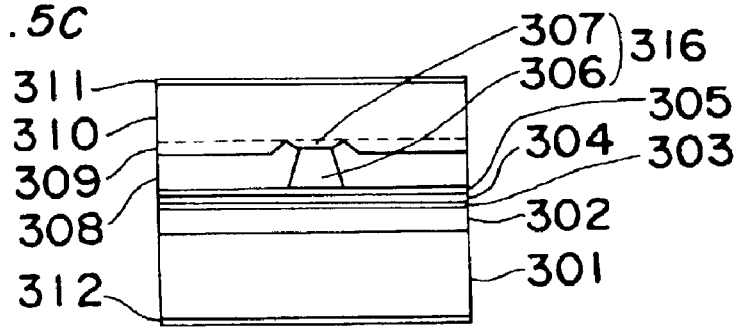

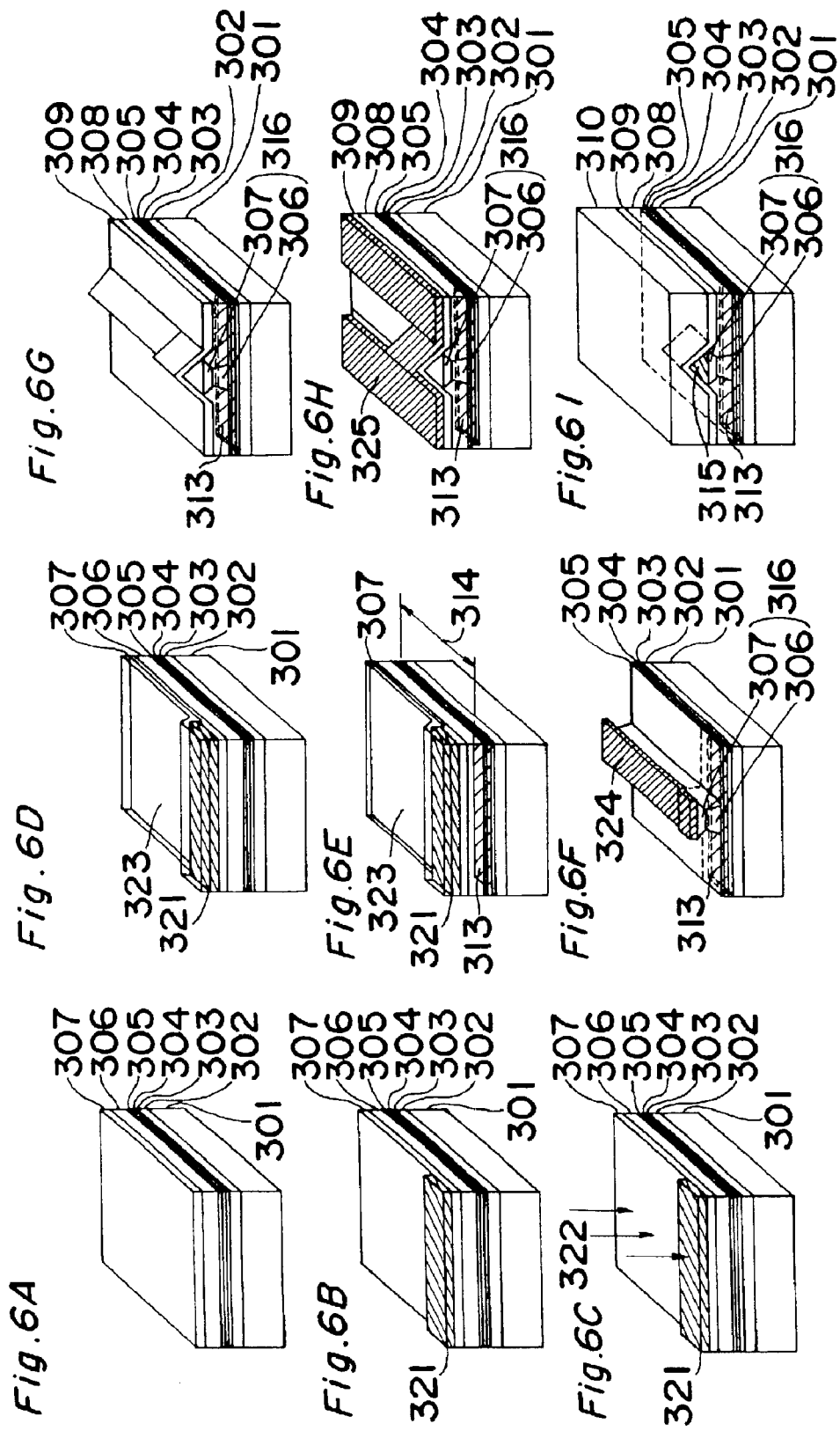

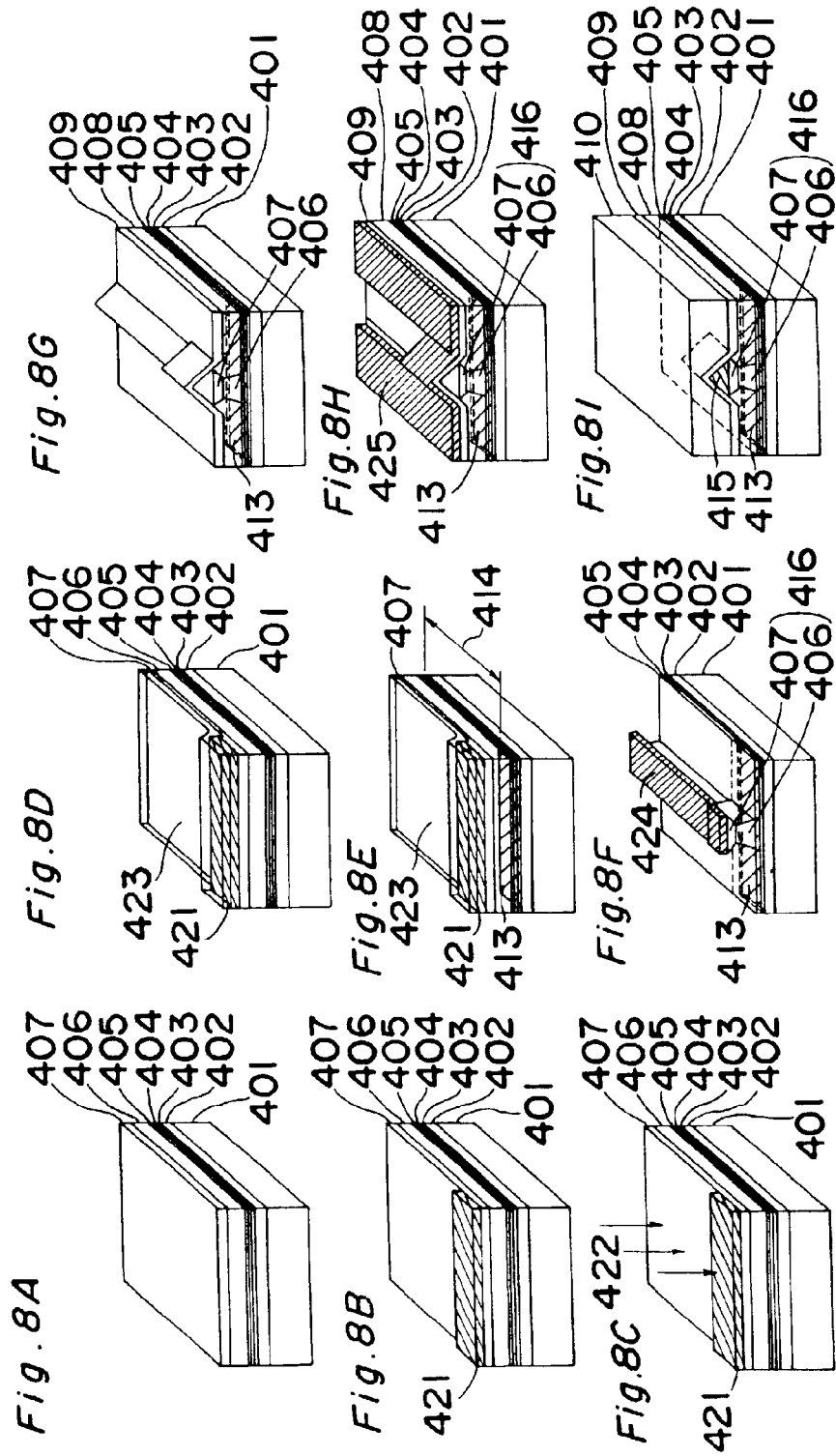

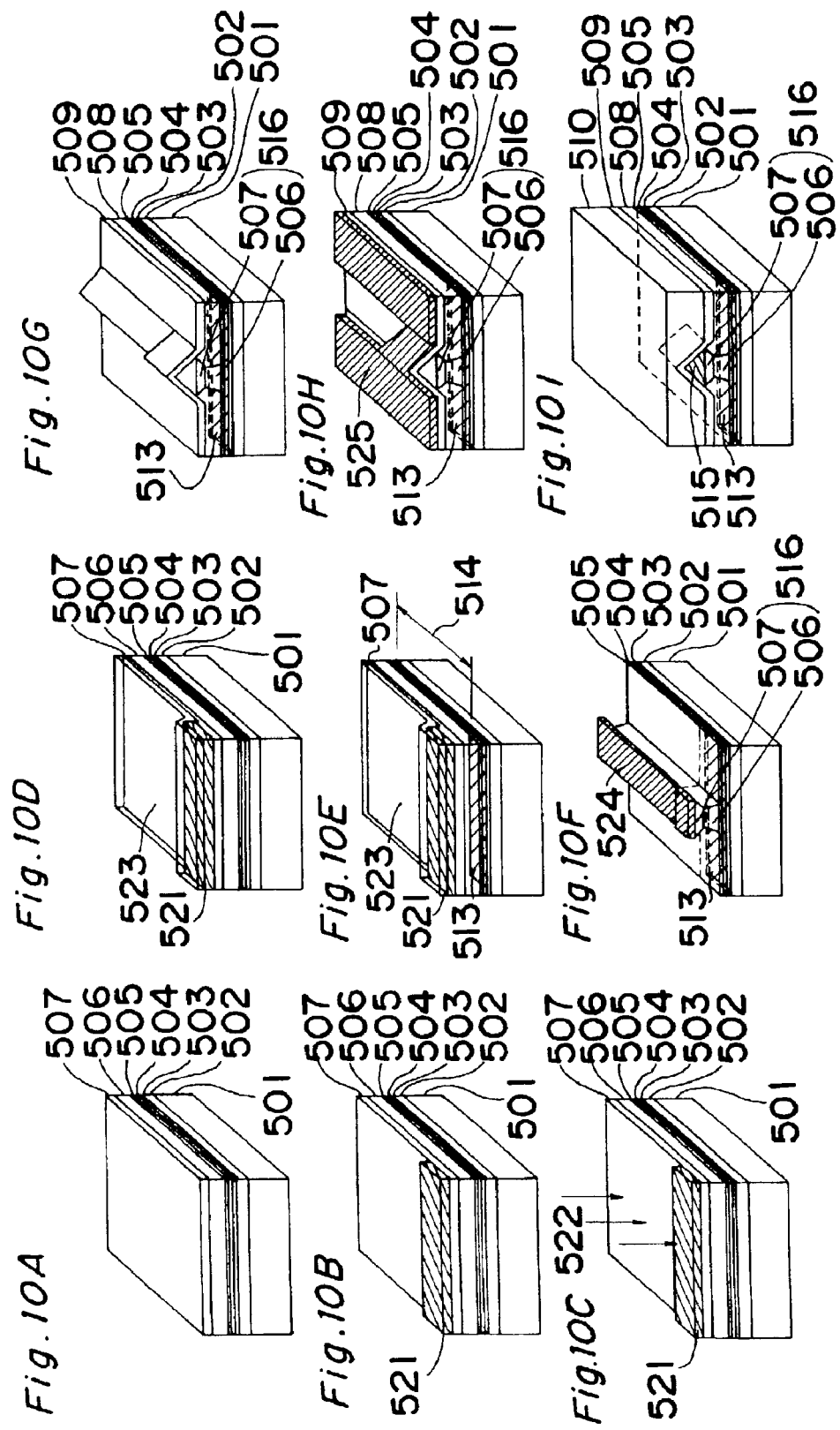

AFTER FIRST-TIME GROWTH    AFTER THERMAL ANNEALING

AFTER FIRST-TIME GROWTH    AFTER THERMAL ANNEALING

SEMICONDUCTOR LASER DEVICE AND METHOD FOR MANUFACTURING THE SAME

TECHNICAL FIELD

The present invention relates to a semiconductor laser element for use in an optical disk system device or the like and a fabricating method therefor and, in particular, to a high-output-power window structure semiconductor laser element and a fabricating method therefor.

BACKGROUND ART

In recent years, various sorts of semiconductor lasers are widely generally used as light sources for optical disk devices. Among others, a high-output-power semiconductor laser is used as a light source for write into disks of an MD drive, an MO drive, a CD-R/RW drive, a writable DVD drive or the like and is demanded to have a higher output power.

One factor of hindering the increase in output power of the semiconductor laser is an optical damage (COD: Catastrophic Optical Damage) that occurs with an increase in the optical output density in an active layer region located in the vicinity of a resonator end surface.

This COD occurs for the reason that the active layer region located in the vicinity of the resonator end surface of the active layer is a laser light absorbing region. A great number of nonluminescence recombination centers, which is called the surface state or the interface state, exist on the resonator end surface. Carriers injected into a region in the vicinity of the resonator end surface of the active layer are lost by this nonluminescence recombination, and therefore, the injection carrier density in the vicinity of the resonator end surface of the active layer is less than in the internal region of the active layer. As a result, the region located in the vicinity of the resonator end surface of the active layer becomes an absorption region with respect to the wavelength of the laser light formed by the carrier of high injection density in the internal region of the active layer.

When the optical output density is increased, local heating in the absorption region becomes increased, the temperature rises and the bandgap is reduced. As a result, a positive feedback that the absorption coefficient becomes further increased and the temperature rises takes effect, and the temperature of the absorption region formed in the vicinity of the resonator end surface of the active layer finally reaches the melting point, causing the COD.

For the improvement of this COD level, a method for utilizing a window structure based on the disorder of a multiple quantum well structure active layer is disclosed as a method for increasing the output power of the semiconductor laser in Japanese Patent Laid-Open Publication No. HEI 9-23037. This semiconductor laser element will be described with reference to FIGS. 17A through 17C, which are structural views thereof, and FIGS. 18A through 18D, which are process charts of the fabricating method thereof.

FIG. 17A is a perspective view including the resonator end surface. FIG. 17B is a sectional view taken along the line Ib—Ib in FIG. 17A. FIG. 17C is a sectional view in the direction of layer thickness taken along the line Ic—Ic in FIG. 17A.

FIGS. 17A through 17C show a GaAs substrate 1001, an n-type AlGaAs lower clad layer 1002, a quantum well active layer 1003, a p-type AlGaAs upper clad layer 1004a, a p-type AlGaAs second upper clad layer 1004b, a p-type GaAs contact layer 1005, a hole diffusion region (hatched region) 1006, a proton implantation region (hatched region) 1007, an n-side electrode 1008, a p-side electrode 1009, a resonator end surface 1020, a region (hereinafter referred to as an internal region) 1003a that contributes to the laser oscillation of the quantum well active layer 1003 and a window structure region 1003b formed in the vicinity of the resonator end surface 1020 of the quantum well active layer 1003.

In FIGS. 18A through 18D, the n-type AlGaAs lower clad layer 1002, the quantum well active layer 1003 and a p-type AlGaAs first upper clad layer 1004a are successively epitaxially grown on the n-type GaAs substrate 1001 (FIG. 18A). Next, an $SiO_2$ film 1010 is formed on the p-type AlGaAs first upper clad layer 1004a, and a stripe-shaped opening 1010a that extends in the direction of the resonator is formed with a length that does not reach the resonator end surface (FIG. 18B). Next, when this wafer is subjected to heat treatment (i.e., thermal annealing) at a temperature of not lower than 800° C. in an As atmosphere, then the $SiO_2$ film 1010 sucks up Ga atoms from the surface of the p-type AlGaAs first upper clad layer 1004a put in contact with the $SiO_2$ film 1010, generating Ga holes in the p-type AlGaAs first upper clad layer 1004a. The holes diffuse until the holes reach the quantum well active layer 1003 inside the crystal, disordering the quantum well structure. The window region of the active layer in which the quantum well structure is disordered functions as a transparent window with respect to the oscillated laser light emitted in the internal region since the effective forbidden bandwidth of the active layer is extended.

Finally, the $SiO_2$ film 1010 is removed, and the p-type AlGaAs-second upper Clad layer 1004b and the p-type GaAs contact layer 1005 are successively epitaxially grown on the p-type AlGaAs first upper clad layer 1004a (FIG. 18C). Next, a resist film is formed on the p-type GaAs contact layer 1005, and a stripe-shaped resist 1011 is formed in the same region as that of the stripe-shaped opening 1010a of the $SiO_2$ film 1010 by the photolithographic technology. Next, a proton is injected from the surface side of the p-type GaAs contact layer 1005 with the stripe-shaped resist 1011 used as a mask, forming a high-resistance region 1007 that becomes a current block layer (current obstructing layer) (FIG. 18D). Finally, the n-side electrode 1008 is formed on the GaAs substrate 1001 side, and the p-side electrode 1009 is formed on the p-type GaAs contact layer 1005. The wafer is cleaved to obtain the semiconductor laser element of FIG. 17.

However, in the conventional window structure semiconductor laser element, the $SiO_2$ film 1010 is formed on the surface of the p-type AlGaAs first upper clad layer 1004a so as to provide a bandgap larger than a bandgap corresponding to the laser oscillation wavelength in the disordered region formed in the vicinity of the resonator end surface, generating Ga holes in the p-type AlGaAs first upper clad layer 1004a put in contact with the $SiO_2$ film 1010 and diffusing the Ga holes into the quantum well active layer 1003.

The generation and diffusion of the Ga holes occur in the region covered with the $SiO_2$ film 1010. If heat treatment is performed at a temperature of not lower than 800° C., then Ga holes are generated though a little in amount by the re-evaporation of Ga atoms on the surface of the region (resonator internal region) that is not covered with the $SiO_2$ film 1010, and the Ga holes diffuse into the quantum well active layer 1003. This consequently causes a reduction in long-term reliability due to the wavelength fluctuation accompanying the fluctuation in the bandgap of the quantum well active layer in the resonator internal region and due to the deterioration in the crystallinity of the quantum well active layer.

Moreover, the diffusion of Ga holes into the quantum well active layer 1003 in the resonator internal region can be restrained by lowering the heat treatment temperature or shortening the heat treatment time (i.e., annealing time). However, the generation of holes in the region covered with the SiO$_2$ film 1010 and the diffusion of the holes into the quantum well active layer 1003 in the region located in the vicinity of the resonator end surface of the active layer under the region covered with the SiO$_2$ film 1010 become insufficient, by which the laser light is disadvantageously absorbed in the window region of the active layer, or the region located in the vicinity of the resonator end surface of the active layer. As a result, the COD tends to easily occur in the active layer region located in the vicinity of the resonator end surface, causing a reduction in the maximum optical output when the element is driven at high power and failing in obtaining sufficient long-term reliability.

DISCLOSURE OF THE INVENTION

As the result of examining the aforementioned problems, the present invention has the object of providing a semiconductor laser element that restrains the bandgap fluctuation of an active layer in a resonator internal region during a window structure process, or restrains the fluctuation in the oscillation wavelength and has excellent long-term reliability when driven at high power as well as a fabricating method therefor.

In order to achieve the above object, there is provided a semiconductor laser element comprising on a substrate at least a first conductive type first clad layer, an active layer, a second conductive type second clad layer, a current block layer having a stripe-shaped deficient portion that extends in a direction of a resonator, a second conductive type third clad layer buried in the stripe-shaped deficient portion of the current block layer and a second conductive type protection layer provided on the third clad layer, wherein the active layer is constructed of at least a window region adjacent to its one end surface and an internal region having a quantum well structure, and a portion opposite to the internal region is irradiated with an ionized atom from a surface of a layer arranged on the second conductive type second clad layer side and thereafter subjected to heat treatment.

Therefore, by applying the ionized atoms onto the surface of the protection layer arranged on the second clad layer side opposite to the internal region, the Ga holes are trapped in the defect formed on the surface by the heat treatment, enabling the prevention of the diffusion of the Ga holes into the internal region and the prevention of a change in the bandgap of the internal region. Therefore, the bandgap of the window region could be made 5 nm larger than the bandgap of the internal region. Since the bandgap of the window region can be made sufficiently larger than the bandgap of the internal region, this arrangement is effective particularly for the restraint of the end surface deterioration and excellent in improving the reliability.

Also, there is provided a semiconductor laser element comprising on a substrate at least a first conductive type first clad layer, an active layer, a second conductive type second clad layer, a current block layer having a stripe-shaped deficient portion that extends in a direction of a resonator, a second conductive type third clad layer buried in the stripe-shaped deficient portion of the current block layer and a second conductive type protection layer provided on the third clad layer, wherein the active layer is constructed of at least a window region adjacent to its one end surface and an internal region having a quantum well structure, a peak wavelength $\lambda w$ of photoluminescence from the window region of the active layer has a relation of:

$$\lambda w \leq \lambda i - 5 \text{ nm}$$

with respect to a peak wavelength $\lambda i$ of photoluminescence from the internal region of the active layer, and a half-width of the photoluminescence from the window region is narrower than a half-width of the photoluminescence from the internal region.

Therefore, since the bandgap of the window region of the active layer adjacent to the resonator end surface is sufficiently larger than the bandgap of the internal region of the active layer, the quantity of light absorption in the window region can be made sufficiently small. Moreover, since the half-width of the photoluminescence from the window region is narrower than the half-width of the photoluminescence from the internal region, the defect in the active layer is filled with the impurities in the internal region, and this arrangement is consequently excellent in improving the reliability.

In one embodiment of the present invention, a layer thickness of the second conductive type protection layer of the portion opposite to the window region is thicker than a layer thickness of the second conductive type protection layer of the portion opposite to the internal region.

Therefore, the mask for the formation of the first conductive type current block layer can easily be aligned in position by using the difference in thickness of the protection layer as a mark. This arrangement allows the simplification of the end surface forming process and enables the obtainment of a semiconductor laser element excellent in mass-productivity.

In one embodiment of the present invention, a length Lw that belongs to the window region and extends in the direction of the resonator is not smaller than 10 $\mu$m.

Therefore, since the carriers (holes or electrons) injected into the internal region diffuse to the end surface and do not recombine, the efficiency of conversion of light into a current is not reduced.

In one embodiment of the present invention, a total value of a thickness of the quantum well layer that constitutes the quantum well structure is not greater than 40 nm.

Therefore, the bandgap of the window region of the active layer can be further increased by the diffusion of the holes into the active layer located in the vicinity of the resonator end surface during the heat treatment. For the above reasons, the end surface deterioration can be largely restrained, and a high-output-power window structure semiconductor laser element excellent in improving the reliability can be obtained.

In one embodiment of the present invention, a first conductive type current injection prevention layer is provided in the portion opposite to the window region located on the second conductive type protection layer.

Therefore, the current flow through the window region can be prevented by providing the current injection prevention layer, and the change in the composition or the diffusion of the impurities in accordance with the movement of the holes during electrification can be prevented by preventing the movement of the holes. This arrangement is effective in improving the reliability.

In one embodiment of the present invention, a length Lp that belongs the first conductive type current injection prevention layer and extends in the direction of the resonator has a relation of:

$$Lw \leq Lp$$

with respect to Lw.

Therefore, since the electrification to the window region can be prevented when the length of the current injection prevention layer is set approximately equal to the length of the window region, the occurrence of a wattless current in the active layer of the window region can be prevented, and this arrangement is effective in improving the reliability. Moreover, no current is flown through the region where the holes are diffused in the resonator internal region when the current injection prevention layer is set longer than the window region. With this arrangement, the holes diffused into the resonator internal region cause neither the generation of a minute defect in the active layer due to the injected current nor the increase of the current during electrification. Therefore, a laser element that has satisfactory reliability over a long period of time can be obtained.

In one embodiment of the present invention, a width of a portion opposite to the window region of the stripe-shaped deficient portion is wider than a width of a portion opposite to the internal region.

Therefore, since the density of light in the stripe of the window region can be reduced, and this arrangement is more effective for restraining the end surface deterioration and effective for improving the long-term reliability. Moreover, since the stripe width of the resonator internal region can be narrowed, the transverse mode of laser can be stabilized, and kink can be prevented from appearing in the I-L characteristic.

Moreover, in the semiconductor laser element of the present invention, the concentration of the group II element in the internal region is made greater than the concentration of the group II element in the window region.

Therefore, since the group II element diffused into the active layer enters the site of the holes in the active layer, the occurrence of crystal defect can be prevented. As a result, the deterioration of the internal region can be restrained during electrification. Moreover, if the group II element diffuses into the active layer of the window region, then light absorption is caused. Consequently, the light absorption is further restrained when the amount of the group II element in the active layer of the window region is small, and the reliability during the high-power operation is improved. This element is excellent in the long-term reliability when driven at high power.

Moreover, in the semiconductor laser element of the present invention, the substrate is GaAs, and each layer is constructed of a GaAlAs based material.

Therefore, the Ga atoms are absorbed by the dielectric film formed on the wafer surface located in the vicinity of the resonator end surface during the heat treatment, and the diffusion speed of the generated Ga holes is especially fast in AlGaAs. Therefore, the bandgap of the window region of the active layer can be more largely varied and increased by the diffusion of the Ga holes into the active layer. As described above, using AlGaAs is effective in restraining the end surface deterioration by the present fabricating method and excellent in improving the reliability.

Also, there is provided a semiconductor laser element fabricating method comprising the steps of: forming a DH wafer in which at least a first conductive type first clad layer, an active layer and a second conductive type second clad layer are laminated on a substrate; forming a first dielectric film in a portion of a surface of a layer arranged on the second clad layer side of the DH wafer; applying an ionized atom to a side which belongs to the wafer and on which the first dielectric film is formed; and subjecting the DH wafer to which the ionized atom is applied to a heat treatment.

Therefore, numbers of minute crystal defects are generated in the vicinity of the surface of the layer arranged on the second clad layer side, and this crystal defect captures the holes generated on the wafer surface by the re-evaporation of the Ga atoms during the heat treatment and prevents the holes from diffusing and disordering the active layer. With this arrangement, the bandgap fluctuation of the active layer in the resonator internal region during the window structure forming process, i.e., the fluctuation of the oscillation wavelength is restrained. At the same time, the crystal quality degradation of the active layer can be restrained, and a semiconductor laser element excellent in the long-term reliability when driven at high power can be obtained.

Moreover, the semiconductor laser element fabricating method of the present invention includes the process of forming a second conductive type protection layer in the upper portion of the second clad layer.

Therefore, even if a contaminant and a needless surface oxide film are formed on the DH wafer surface, they can be concurrently removed before the heat treatment.

Moreover, according to the semiconductor laser element fabricating method of the present invention, the surface of the protection layer is etched before the DH wafer is subjected to the heat treatment.

Therefore, the contaminant and the surface oxide film, which adhere to the DH wafer surface, can be removed, and the generation of the crystal defect on the surface of the protection layer by the irradiation of the ionized atoms is promoted. This crystal defect captures the holes generated on the surface of the protection layer during the heat treatment and prevents the holes from diffusing in the direction of the n-type GaAs substrate and from disordering the active layer. With this arrangement, the bandgap fluctuation of the active layer in the internal region can be prevented.

In one embodiment of the present invention, the ionized atom is applied to the DH wafer surface on the first dielectric film side, concurrently with the etching of the surface of the layer arranged on the second clad layer side of the DH wafer.

Therefore, the removal of the contaminant and the surface oxide film that adhere to the surface and the formation of the dielectric film can be concurrently performed. Therefore, even if the semiconductor laser element fabricating process is simplified, the generation of the crystal defect on the surface of the protection layer by the irradiation of the ionized atoms is promoted.

In one embodiment of the present invention, after the ionized atom is applied to the DH wafer surface on the first dielectric film side, a second dielectric film is formed so as to cover the entire wafer surface.

Therefore, it is not required to generate the crystal defect on the wafer surface through the dielectric film and increase the ion energy during ion irradiation. Accordingly, there is no possibility of the occurrence of the intrusion of the crystal defect from the surface of the protection layer of the wafer deep into the crystal interior, and there is no possibility of the occurrence of the diffusion of the defect into the active layer during the heat treatment and the degradation in reliability.

In one embodiment of the present invention, after the second dielectric film is formed, the DH wafer is subjected to heat treatment.

Therefore, by the inclusion of the process of forming the dielectric film on the DH wafer surface opposite to the internal region before the heat treatment process, the generation of superfluous Ga holes by the re-evaporation through the heat treatment can be prevented. Therefore, the Ga holes can be sufficiently caught by the defect formed on the surface, and this arrangement is further effective for improving the reliability.

In one embodiment of the present invention, the ionized atom is applied to the DH wafer surface on the first dielectric film side, concurrently with the formation of the second dielectric film.

Therefore, the ion irradiation is performed in the vicinity of the surface of the layer arranged on the second clad layer side, by which the process of forming a minute crystal defect and the process of cleaning the surface of the second dielectric film can be concurrently performed, allowing the fabricating process to be simplified.

In one embodiment of the present invention, the ionized atom is one or a plurality of atoms selected from the group consisting of argon, oxygen and nitrogen.

Therefore, the crystal defect can be generated only in the vicinity of the wafer surface, and the defect can efficiently capture the Ga holes generated on the wafer surface during the heat treatment. Therefore, this arrangement is suitable for preventing the bandgap fluctuation of the active layer. Moreover, this arrangement is able to restrain the diffusion of the defect into the active layer during the heat treatment and is suitable for preventing the degradation in reliability.

In one embodiment of the present invention, the second dielectric film is formed in a portion, which belongs to the wafer surface and on which the first dielectric film is not formed, by applying the ionized atom.

Therefore, the ion irradiation is performed in the vicinity of the surface of the layer arranged on the second clad layer side, by which the process of forming a minute crystal defect and the process of cleaning the surface of the second dielectric film can be concurrently performed, allowing the fabricating process to be simplified.

In one embodiment of the present invention, an ion energy of the ionized atom is set not greater than 3000 eV and more preferably set not smaller than 500 eV and not greater than 1500 eV.

Therefore, a sufficient amount of defect can be generated in the internal region while preventing the ionized atoms from penetrating the dielectric film in the region located in the vicinity of the end surface. Therefore, the disordering of the quantum well structure of the window region of the active layer is sufficient and the bandgap can be increased to the desired value. Since the end surface deterioration can be restrained, a semiconductor laser element that has high reliability can be fabricated.

Moreover, according to the semiconductor laser element fabricating method of the present invention, the apparatus that applies the ionized atom is the apparatus that has an ion acceleration function.

Therefore, the ion energy and the amount of ions can be precisely controlled, and the amount of the crystal defect generated on the wafer surface can be controlled. Therefore, the distribution and the amount of Ga holes can also be controlled, and the amount of the bandgap fluctuation of the internal region can easily be controlled.

Moreover, according to the semiconductor laser element fabricating method of the present invention, the apparatus that applies the ionized atom is an apparatus selected from a group consisting of an ion gun, an ion implanter and an ion assist vapor deposition system.

Therefore, if the above device is used, the ion energy and the amount of ions can be precisely controlled, and the amount of the crystal defect generated on the DH wafer surface can be controlled. Therefore, the distribution and the amount of Ga holes can also be controlled, and the amount of the bandgap fluctuation of the internal region can easily be controlled. Furthermore, the ion assist vapor deposition system is a general system in the semiconductor process, and there is the advantage that the fabricating method can be simplified.

Moreover, according to the semiconductor laser element fabricating method of the present invention, the apparatus that applies the ionized atom is an apparatus that has a function of generating plasma.

Therefore, the ion energy can be precisely controlled, and the amount of the crystal defect generated on the DH wafer surface can be controlled. Therefore, the distribution and the amount of Ga holes can also be controlled, and the amount of the bandgap fluctuation of the internal region can easily be controlled.

Moreover, according to the semiconductor laser element fabricating method of the present invention, the apparatus that applies the ionized atom is an apparatus selected from a group consisting of a plasma CVD system, a sputtering system and a plasma ashing system.

Therefore, since the ion irradiation and the formation of the dielectric film can be performed by the same apparatus, there is no concern about the characteristic change due to the exposure of the surface that has undergone ion irradiation to the atmosphere. Moreover, there is an advantage that the contaminant on the surface can be removed by performing etching before the formation of the dielectric film. Furthermore, the plasma CVD system and the sputtering system are general systems in the semiconductor process, and there is an advantage that the fabricating method can be simplified.

Moreover, according to the semiconductor laser element fabricating method of the present invention, the first dielectric film includes a material selected from the group consisting of $SiO_x$, $SiN_x$ and $SiO_yN_x$ (note that x and y are positive real numbers) that contains an Si atom.

Therefore, the Ga atoms on the wafer surface are efficiently absorbed during the heat treatment, and numbers of holes are generated. The holes are diffused into the active layer to increase the bandgap of the window region of the active layer. This allows the quantity of light absorption in the region located in the vicinity of the resonator end surface to be reduced and enables a laser element excellent in the long-term reliability to be obtained.

Moreover, according to the semiconductor laser element fabricating method of the present invention, the thickness of the first dielectric film is set not greater than 1 $\mu$m.

Therefore, no film is peeled off by the difference in the expansion coefficient between the dielectric film and the wafer surface during the heat treatment. There is no possibility of the occurrence of the reduction in the bandgap increase of the active layer located in the vicinity of the end surface due to the reduction in the number of holes generated on the wafer surface and the reduction in the number of holes diffused in the active layer.

In one embodiment of the present invention, the second dielectric film has a thickness of not greater than 0.5 $\mu$m.

Therefore, the number of holes generated by the heat treatment is sufficiently smaller than that of the window region. Accordingly, there is no possibility of the occurrence of a failure in preventing the diffusion of holes into the active layer, and this arrangement is suitable for restraining the bandgap fluctuation of the internal region of the active layer.

In one embodiment of the present invention, the first dielectric film and the second dielectric film are made of materials that have almost equal thermal expansion coefficients.

Therefore, since the wafer surface in the vicinity of the resonator end surface and inside the resonator is covered with the dielectric film of almost the same thermal expansion coefficient, the distortion ascribed to the difference in the thermal expansion coefficient between the resonator end surface and the resonator interior by the heat treatment can be further reduced, producing an effect for improving the reliability. The distortion caused by the difference in the thermal expansion coefficient between the resonator end surface and the resonator interior by the heat treatment can be reduced, and this enables the obtainment of a fabricating method of a high-output-power semiconductor laser element excellent in the long-term reliability.

In one embodiment of the present invention, assuming that the first dielectric film has a thickness of d1 and the second dielectric film has a thickness of d2, then there is a relation expressed by:

$$d1 > d2.$$

Therefore, a large amount of holes can be generated by the heat treatment by virtue of the great film thickness of the dielectric film in the vicinity of the resonator end surface, and the holes can be diffused into the active layer. Therefore, the bandgap increase in the window region of the active layer can be promoted. At the same time, by virtue of the arrangement that the film thickness of the dielectric film inside the resonator is thinner than in the vicinity of the resonator end surface, the holes generated by the heat treatment can be reduced, and the diffusion of the holes into the internal region of the active layer can be restrained. As described above, the reliability is improved by the restraint of the end surface deterioration. At the same time, the bandgap fluctuation of the internal region of the active layer inside the resonator can be restrained.

In one embodiment of the present invention, the heat treatment is performed at a DH wafer retention temperature of not lower than 800° C. within 100 seconds of a temperature rise time up to the retention temperature or, more preferably, at a DH wafer retention temperature of not lower than 900° C. within 60 seconds of the temperature rise time up to the retention temperature.

Therefore, the holes generated by the absorption of the Ga atoms into the dielectric film in the vicinity of the resonator end surface become easily diffuse into the active layer, and this allows the bandgap increase of the active layer to be promoted. Moreover, the diffusion of the dopant inside the resonator can be prevented, and the degradation in reliability in accordance with the diffusion of the dopant can be prevented, and this enables the provision of a fabricating method of a semiconductor laser element excellent in the long-term reliability.

BRIEF DESCRIPTION OF THE DRAWINGS

FIGS. 2A through 2H are views for explaining the semiconductor laser element fabricating method of the first embodiment of the present invention;

FIGS. 4A through 4I are views for explaining the semiconductor laser element fabricating method of the second embodiment of the present invention;

FIGS. 5A through 5C are a perspective view and sectional views showing the structure of a semiconductor laser element according to a third embodiment of the present invention;

FIGS. 6A through 6I are views for explaining the semiconductor laser element fabricating method of the third embodiment of the present invention;

FIGS. 8A through 8I are views for explaining the semiconductor laser element fabricating method of the fourth embodiment of the present invention;

FIGS. 10A through 10I are views for explaining the semiconductor laser element fabricating method of the fifth embodiment of the present invention;

BEST MODE FOR CARRYING OUT THE INVENTION

Figure 1A:
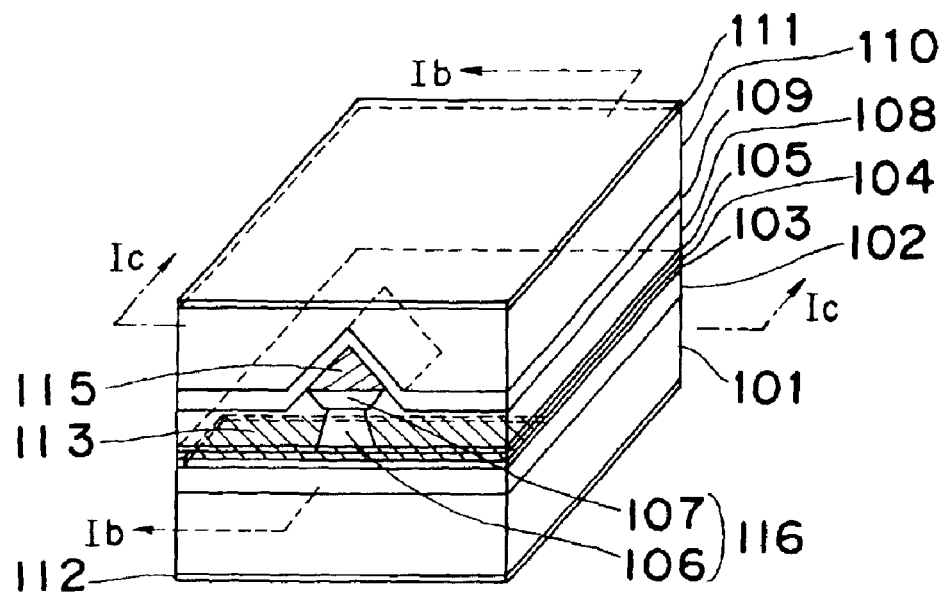
FIGS. 1A through 1C are a perspective view and sectional views showing the structure of a semiconductor laser element according to a first embodiment of the present invention.

The present invention will be described in detail below on the basis of the embodiments shown in the drawings.

FIGS. 1A through 16 are views of a semiconductor laser element and a fabricating method therefor according to one embodiment of the present invention.

First Embodiment

Figure 1B:
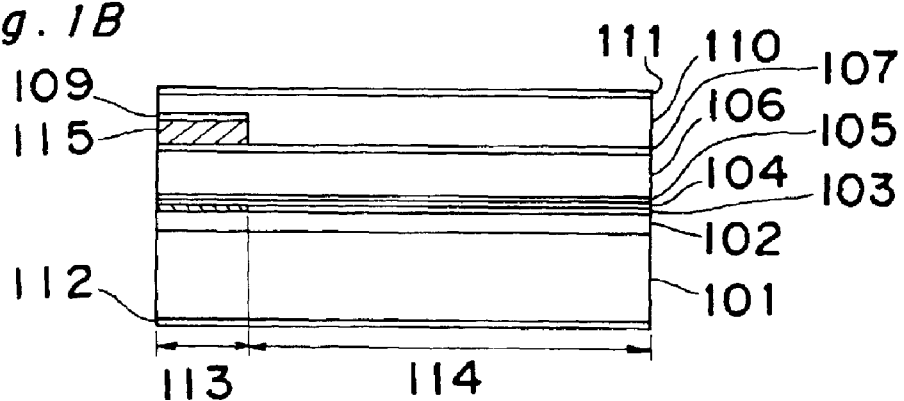
Figure 1C:
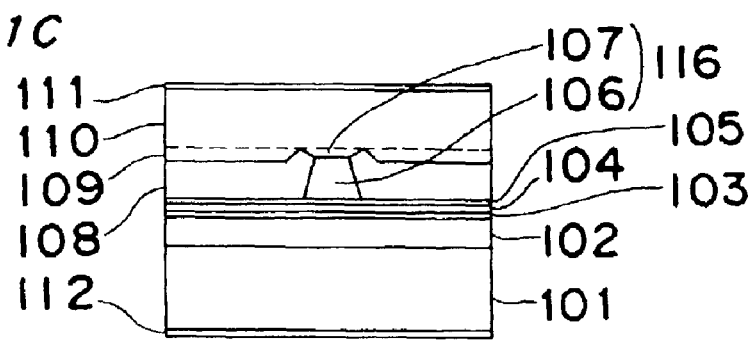

FIGS. 1A through 1C show the structure of a semiconductor laser element according to the first embodiment of the present invention. Regarding FIGS. 1A through 1C, FIG. 1A is a perspective view including a light-emitting end surface, FIG. 1B is a sectional view of a waveguide taken along the line Ib—Ib in FIG. 1A, and FIG. 1C is a sectional view taken in the direction of layer thickness along the line Ic—Ic in FIG. 1A.

There are provided a first conductive type n-type GaAs substrate 101, a first conductive type n-type $Al_{x1}Ga_{1-x1}As$ (x1 is greater than zero and not greater than one) first clad layer 102, a multiple quantum well active layer (MQW active layer) 103 in which a multiple quantum well structure obtained by alternately laminating barrier layers and well layers is interposed between optical guide layers, a second conductive type p-type $Al_{x1}Ga_{1-x1}As$ second clad layer 104, a p-type GaAs etching stop layer 105, a second conductive type p-type $Al_{x1}Ga_{1-x1}As$ third clad layer 106 constructed of a ridge stripe that extends in the direction of a resonator, a second conductive type p-type GaAs protection layer 107, an n-type $Al_{y1}Ga_{1-y1}As$ (y1 is greater than zero and not greater than one) current block layer (current obstruction layer) 108 formed so as to bury the side surfaces of the p-type $Al_{x1}Ga_{1-x1}As$ third clad layer 106 constructed of the ridge stripe, a p-type GaAs flattening layer 109, a p-type GaAs contact layer 110, a p-side electrode 111 and an n-side electrode 112.

The multiple quantum well active layer 103 is constructed of a window region 113 and an internal region (also referred to as an active region) 114. The window region 113 is a region whose bandgap is larger than the bandgap of the internal region 114, while the internal region 114 is a region that has a gain for achieving laser oscillation. There are provided an n-type $Al_{y1}Ga_{1-y1}As$ current injection prevention layer 115 formed on the p-type GaAs protection layer 107 and a ridge stripe 116 constructed of the p-type $Al_{x1}Ga_{1-x1}As$ third clad layer 106 and the p-type GaAs protection layer 107. As explained according to the following fabricating method, this window region 113 is formed by applying ionized atoms from the surface side of the second conductive type protection layer 107 and thereafter performing heat treatment (thermal annealing) with a temperature rise in a short time for heating, i.e., rapid thermal annealing (hereinafter referred to as RTA).

Next, the fabricating method will be described with reference to FIGS. 2A through 2H. The first conductive type n-type $Al_{x1}Ga_{1-x1}As$ first clad layer 102, the non-doped MQW active layer 103, the second conductive type p-type $Al_{x1}Ga_{1-x1}As$ second clad layer 104, the p-type GaAs etching stop layer 105, the second conductive type p-type $Al_{x1}Ga_{1-x1}As$ third clad layer 106 and the second conductive type p-type GaAs protection layer 107 are successively epitaxially grown on the first conductive type n-type GaAs substrate 101 by a first-time metal-organic chemical vapor deposition (MOCVD) method, and a DH wafer is obtained (FIG. 2A).

An $SiO_{z1}$ film (z1 is a real number close to one, and its thickness is 0.5 μm) 121, which is a stripe-shaped dielectric film of a width of 40 μm in a direction parallel to the end surface, is formed by the plasma CVD method and the photolithographic method on the surface of the p-type GaAs protection layer 107 in a region located in the vicinity of the resonator end surface. In this case, the dielectric film formed by the plasma CVD method and the deposition of the sputtering method or the like is in a state close to the amorphous state, and therefore, the composition z1 of the film has a value close to one. However, this value, which varies every time the film is formed and is not constant depending on the place, is expressed by $SiO_{z1}$. The pitch of the stripe-shaped dielectric film 121 formed on the semiconductor wafer was set to 1600 μm, which is two times the resonator length (FIG. 2B).

Next, ionized atoms 122 are applied (ion irradiation) to the wafer surface located on the p-type GaAs protection layer 107 side. According to the fabricating method of the semiconductor laser element of the first embodiment of the present invention, ion gas was used for the ion irradiation, argon (Ar) ions were used as the ionized atoms, and the ion irradiation energy was set to 1000 eV (FIG. 2C).

Next, by the RTA, the bandgap of the MQW active layer in the region located in the vicinity of the resonator end surface just below the $SiO_{z1}$ film 121 is made greater than the bandgap of the MQW active layer in the resonator internal region. With regard to heat treatment conditions at this time, the temperature was raised from the room temperature to a temperature of 950° C. in 30 seconds, retained for 60 seconds and thereafter cooled. To achieve the high-speed temperature rise as described above, a lamp heating method for heating the protection layer 107 surface side of the wafer by means of a lamp was used. As a result, in the multiple quantum well active layer (MQW active layer) 103, the window region 113 and the internal region 114 are formed in the direction of the resonator (FIG. 2D).

The dielectric film 121 formed on the surface of the p-type GaAs protection layer 107 is removed, and a stripe-shaped resist mask 123 that extends in the [011] direction on the p-type GaAs protection layer 107 is formed by using the normal photolithographic technology. By using the normal etching technology, the p-type GaAs protection layer 107 and the p-type $Al_{x1}Ga_{1-x1}As$ third clad layer 106 are processed into a stripe-shaped ridge 116 that has a width of 2.5 μm and extends in the [011] direction so as to reach the p-type etching stop layer 105 (FIG. 2E).

Next, the stripe-shaped resist mask 123 formed on the p-type GaAs protection layer 107 is removed, and the side surfaces of the ridge 116 constructed of the p-type GaAs protection layer 107 and the p-type $Al_{x1}Ga_{1-x1}As$ third clad layer 106 ate buried in an n-type $Al_{y1}Ga_{1-y1}As$ current block layer 108 by a second-time MOCVD method and then buried in a p-type GaAs flattening layer 109 (FIG. 2F).

By using the normal photolithographic technology, a resist mask 124 is formed on the p-type GaAs flattening layer 109 formed on the n-type $Al_{y1}Ga_{1-y1}As$ current block layer 108 and on the p-type GaAs flattening layer 109 formed on the ridge 116 within a range of 40 μm from the resonator end surface. By using the normal etching technology, the n-type $Al_{y1}Ga_{1-y1}As$ current block layer 108 and the p-type GaAs flattening layer 109 located at the opening of the resist mask 124 are selectively removed (FIG. 2G).

The resist mask 124 formed on the p-type GaAs flattening layer 109 is removed, and a p-type GaAs contact layer 110 is formed by a third-time MOCVD method. In the vicinity of the resonator end surface, an n-type $Al_{y1}Ga_{1-y1}As$ current injection prevention layer 115 grown concurrently with the n-type $Al_{y1}Ga_{1-y1}As$ current block layer 108 is formed on the ridge stripe 116 (FIG. 2H).

Next, a p-electrode 111 is formed on the upper surface, and an n-electrode 112 is formed on the lower surface.

Finally, a scribe line is scribed in the non-doped region of the width of 40 μm, i.e., at the approximate center of the window region, and the wafer on which a semiconductor laser element is formed is divided into a laser bar of the resonator length. An $AlO_s$ film (s is a positive real number close to 3/2, and so on) is coated by the electron beam deposition method or the like so that the reflectance of the resonator end surface that has the window region becomes 12%, and a multilayer film obtained by alternately laminating the $AlO_s$ films and amorphous Si films is coated so that the resonator end surface located on the other side comes to have a reflectance of 95%. Also, in this case, the dielectric films such as the $AlO_s$ film and the amorphous Si film formed by the electron beam deposition method are in a state close to an amorphous state. Therefore, the composition s of the film has a value close to 3/2. However, this value, which varies every time the film is formed and is not constant depending on the place, is expressed by AlO$_s$.

By dividing the DH wafer into chips, there is fabricated a semiconductor laser element that has the window region 113 of a length of approximately 20 µm and the current injection prevention layer 115 of a length of approximately 20 µm in the vicinity of the light-emitting side resonator end surface of the resonator that has a length of 800 µm and has the window region. The present semiconductor laser element is used with the resonator end surface located on the light-emitting side.

When the length of the window region becomes shorter than approximately 10 µm, the carriers (holes or electrons) implanted in the internal region diffuse to the end surface and recombine, and therefore, the efficiency of conversion of a current into light is disadvantageously reduced. Moreover, when the length of the window region becomes long, the number of semiconductor laser elements that can be obtained from one wafer is reduced, and therefore, the length Lw of the window region should properly be not smaller than 10 µm and not greater than 50 µm. It is more preferable to provide a design such that Lw is longer than 20 µm and not longer than 40 µm.

By the fabricating method of the semiconductor laser element of the first embodiment, the wafer obtained after the first-time MOCVD growth was measured by the photoluminescence (PL) method, and it was found that the peak wavelength λi of the photoluminescence of the MQW active layer was 775 nm. In this case, the peak wavelength λi by the PL method means the peak wavelength of the fluorescent intensity when the wavelength dependency of the fluorescent intensity generated from the active layer is measured by a spectroscope with Ar laser light of a color of blue to green applied from the wafer surface.

Next, the wafer obtained after the RTA shown in FIG. 2D was partially measured by the PL method with regard to the window region 113 located just below the SiO$_{z1}$ film 121 that has the dielectric film and the internal region 114 located just below the p-type GaAs protection layer 107. As a result, the peak wavelength λw of the photoluminescence of the window region 113 was 745 nm, and the peak wavelength λi of the photoluminescence of the internal region 114 was 775 nm. This meant that the peak wavelength λw of the window region 113 was shifted in wavelength to the shorter wavelength side by 30 nm from the peak wavelength λi of the internal region 114. Moreover, the wavelength of the internal region 114 of the active layer was 775 nm, which was equal to the peak wavelength of the active layer in the wafer (FIG. 2A) immediately after the first-time growth. The value of the inverse number of the photoluminescence peak wavelength corresponds approximately to the bandgap of the semiconductor material. Therefore, it is shown that the window region 113 of the active layer has a bandgap larger than that of the internal region 114 of the active layer.

On the other hand, the half-width of the photoluminescence of the window region 113 became narrower than the half-width of the photoluminescence of the internal region 114. As a reason for the above, it can be considered that the half-width of the photoluminescence of the internal region is widened due to the fact that Zn, which is the p-type impurity (group II atom) added to the second clad layer, the third clad layer and the protection layer, is diffused into the internal region 114 as a consequence of the prevention of the dispersion of Ga holes into the internal region 114.

As described above, in the semiconductor laser element according to the first embodiment of the present invention, it is understood that, if the window region is formed by applying the ionized atom 122 (performing ion irradiation) onto the wafer surface located on the p-type GaAs protection layer 107 side that is the layer arranged on the second clad layer 104 side and thereafter performing the RTA, then the peak wavelength λw of the photoluminescence from the window region of the active layer satisfies the relation of λw ≦ λi−5 nm with respect to the peak wavelength λi of the photoluminescence from the internal region of the active layer.

Moreover, it is also understood that the relation that the half-width of the photoluminescence of the window region 113 is narrower than the half-width of the photoluminescence of the internal region 114 is satisfied.

That is, by applying the ionized atoms onto the surface of the protection layer arranged on the second clad layer side opposite to the internal region, the Ga holes were trapped in the defect formed on the surface, and this could prevent the diffusion of the Ga holes into the internal region and the change in the bandgap of the internal region. As a result, the bandgap of the window region could be increased by 5 nm or more than the bandgap of the internal region. On the other hand, there is no light absorption by the impurity in comparison with the case of the window region formed by the conventional quantum well disordering method according to the Zn diffusion method. Therefore, even if the length of the window region is set to 20 µm or more, there is no influence on the oscillation characteristics, and this enables the scribe line scribing accuracy at the time of chip division to be alleviated.

Moreover, in the semiconductor laser element according to the embodiment of the present invention, the ion irradiation is effected from the surface of the p-type GaAs protection layer 107 that is the uppermost layer arranged on the second clad layer side. However, it is, of course, acceptable to effect the ion irradiation, for example, from the second conductive type second clad layer surface side in the absence of the p-type GaAs protection layer 107 or to effect the ion irradiation from the third clad layer surface side when the second conductive type third clad layer is located on the surface side.

The above fact clarified that the bandgap of the active layer of the window region adjacent to the end surface could be made sufficiently greater than the bandgap of the internal region of the active layer and that the quantity of light absorption in the window region could be sufficiently reduced in the semiconductor laser element using the fabricating method of the present invention. Furthermore, it was clarified that the fluctuation in the bandgap of the active layer of the internal region inside the resonator could be restrained after the first-time growth.

According to the fabricating method of the present invention, numbers of minute crystal defects are generated in the vicinity of the surface of the p-type GaAs protection layer 107 by applying the ionized atoms onto the surface of the p-type GaAs protection layer 107 that is the uppermost layer arranged on the second clad layer side of the internal region of the resonator. This crystal defect captures the holes generated on the wafer surface by the re-evaporation of the Ga atoms during the RTA and prevents the holes from diffusing in the direction of the n-type GaAs substrate 101 and from disordering the active layer. By this operation, the bandgap fluctuation of the active layer of the internal region inside the resonator can be prevented.

The ionized atoms are also applied to the SiO$_{z1}$ film 121. Therefore, the ion energy is adjusted so that the ions do not pass through the $SiO_{z1}$ film and not reach the p-type GaAs protection layer 107 located under the film.

Assuming that the ion energy is, for example, 500 eV when the film thickness of the $SiO_{z1}$ film is 1 μm, then the ratio of the ions that penetrate the $SiO_{z1}$ film is 10% or less, and there are scarce change in the bandgap of the internal region as a result of defect, generated by the penetrating ions, diffusing during the RTA. Moreover, when the ion energy is 3000 eV when the film thickness of the $SiO_{z1}$ film is 0.2 μm, almost all the ions penetrate the $SiO_{z1}$ film.

As the result of the above, no crystal defect occurs on the surface of the p-type GaAs protection layer 107 located just below the $SiO_{z1}$ film 121. Therefore, the Ga atoms are sucked up into the $SiO_{z1}$ film 121 by the RTA, and all the Ga holes generated inside the p-type GaAs protection layer 107 are all diffused in the direction of the n-type GaAs substrate 101, disordering the active layer. Therefore, the bandgap of the active layer located just below the $SiO_{z1}$ film 121 becomes increased, forming the window region 113.

Figure 13:
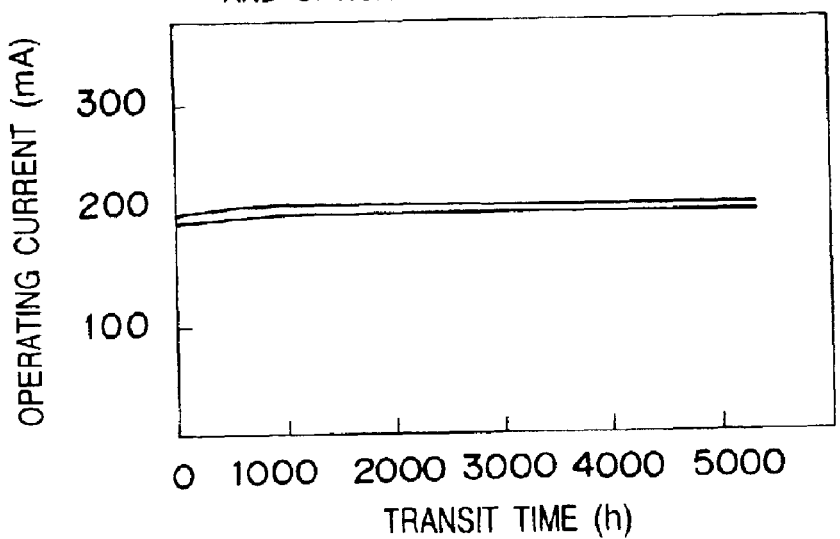
FIG. 13 is a graph showing a change in a drive current with respect to the transit time of the semiconductor laser element of the first embodiment of the present invention.

The characteristics of the semiconductor laser element obtained by the fabricating method of the present invention were evaluated. As a result, an oscillation wavelength of 785 nm conforming to the set wavelength was obtained with an optical output CW of 120 mW in the semiconductor laser element of the present invention. Furthermore, as shown in FIG. 13, the element stably operated with the optical output CW of 120 mW for 5,000 hours or more at an ambient temperature of 70° C., and no such deterioration phenomenon that the operating current increased in operation was observed.

The semiconductor laser element of the present invention can prevent the bandgap fluctuation of the active layer inside the resonator, and therefore, the oscillation wavelength conforming to the setting can be achieved. Furthermore, it was clarified that the element has excellent long-term reliability even when driven at high power.

According to the semiconductor laser element of the first embodiment of the present invention, Ar ions were applied to the p-type GaAs protection layer 107 inside the resonator. However, with either one or a plurality of ions of oxygen (O) ion and nitrogen (N) ion are applied, the crystal defect can be generated only in the vicinity of the wafer surface, and the defect can effectively capture the Ga holes generated on the wafer surface during the heat treatment, and this is suitable for the prevention of the bandgap fluctuation of the active layer. Moreover, the crystal defect is generated only in the vicinity of the wafer surface. This can control the diffusion of the defect into the active layer during the heat treatment and suitable for preventing the deterioration in reliability.

According to the semiconductor laser element and the fabricating method of the first embodiment of the present invention, the irradiation ion energy was set to 1000 eV. The value of the ion energy should properly be not greater than 3000 eV and preferably be not smaller than 500 eV and not greater than 1500 eV. If the ion energy becomes greater than 3000 eV, then the ionized atoms pass through the $SiO_{z1}$ film 121 and reach the p-type GaAs protection layer 107 located under the film, generating the crystal defect on the surface of the protection layer. As a result, the Ga atoms in the GaAs protection layer located just below the $SiO_{z1}$ film are absorbed into the $SiO_{z1}$ film by the RTA, generating Ga holes, and the holes are captured by the crystal defect, reducing the amount of diffusion of holes into the active layer. This causes a problem that the disordering of the quantum well structure of the window region of the active layer is insufficient and the bandgap is not increased to the desired value, as a consequence of which the deterioration of the end surface cannot be restrained, degrading the reliability.

Moreover, in connection with the first embodiment, there has been described the case of the ion gun used as the ion irradiation apparatus. The ion gun can precisely control the ion energy and is excellent in controlling the amount of crystal defect generated on the wafer surface. It is likewise acceptable to perform the ion irradiation by means of an ion implanter that has an ion accelerating function, an ion assist vapor deposition system or the like. These apparatuses can independently control the ion energy and the amount of ions (ionic current) to be applied. Therefore, the distribution of the defect in the direction of depth and the amount of defect can be independently controlled, and accordingly the distribution and the amount of Ga holes can also be controlled. Therefore, the amount of bandgap fluctuation in the internal region can easily be controlled.

On the other hand, it is acceptable to perform the ion irradiation by means of an ion assist vapor deposition system, a plasma CVD system, a sputtering system, an ion generating system of a plasma ashing system or the like. The ion assist vapor deposition system, the plasma CVD system, the sputtering system or the like can perform ion irradiation and dielectric film formation by the same system. Accordingly, there is no concern about the characteristic variation ascribed to the exposure of the surface that has undergone ion irradiation to the atmosphere. Moreover, if a system such as the plasma CVD system, the sputtering system and the plasma generating system of the plasma ashing system or the like is used, there is the advantage that the contaminant on the surface can be removed before the formation of the dielectric film.

Moreover, a film that contains Si is suitable for the dielectric film to be formed on the wafer surface in the vicinity of the resonator end surface in the first embodiment. The film that contains Si efficiently absorbs the Ga atoms on the wafer surface during the RTA of heat treatment and generates numbers of holes. The holes diffuse into the active layer, allowing the bandgap of the window region of the active layer to be increased. The greater the increase in the bandgap of the window region of this active layer is, the further the quantity of light absorption in the region located in the vicinity of the resonator end surface can be reduced, enabling the obtainment of a laser element that has excellent long-term reliability.

In connection with the first embodiment, there has been the description of the use of the $SiO_x$ film as the dielectric film formed on the wafer surface in the vicinity of the resonator end surface. However, besides it, $SiN_x$, $SiO_yN_x$ (x and y are positive real numbers) and the like, which are excellent in generating holes by absorbing Ga atoms on the wafer surface during heat treatment, are suitable for the dielectric film of the present invention.

Moreover, according to the first embodiment, the RTA method is used as a heat treatment method, including a process for raising the temperature up to a temperature of not lower than 800° C. within 100 seconds, retaining the temperature for 100 seconds and thereafter performing cooling. By the rapid heat treatment (RTA) as described above, the holes generated by absorbing Ga atoms into the dielectric film located in the vicinity of the resonator end surface become easy to diffuse into the active layer, allowing the bandgap increase of the active layer to be promoted. Moreover, the diffusion of the dopant inside the resonator can be prevented, and the deterioration in reliability in accordance with the diffusion of the dopant can be prevented, enabling the provision of a semiconductor laser element excellent in the long-term reliability and the fabricating method thereof.

In the first embodiment, the film thickness of the dielectric film formed on the wafer surface of the window region located in the vicinity of the resonator end surface is not greater than 1 μm. When the film thickness is thicker than 1 μm, the film tends to be peeled off due to a difference in the expansion coefficient between the dielectric film and the wafer surface during the heat treatment. For the above reasons, the number of holes generated on the wafer surface is reduced and the number of holes that diffuse into the active layer is reduced, by which the bandgap increase of the active layer in the vicinity of the end surface is reduced. Therefore, the end surface deterioration occurs, degrading the reliability.

The first embodiment employs the structure in which the active layer is obtained by interposing the multiple quantum well structure obtained by alternately laminating the barrier layers and the well layers between the optical guide layers. In the case of the active layer whose quantum well layer thickness is not greater than 30 nm and whose total thickness quantum well layer is not greater than 40 nm, the bandgap of the window region of the active layer can be further increased by the diffusion of holes into the active layer located in the vicinity of the resonator end surface during the heat treatment in comparison with the case of the layer thickness thicker than the above value. Therefore, the end surface deterioration can be sufficiently restrained, and this is excellent in improving the reliability. It is a matter of course that the quantum well layer of the active layer may be constructed of one single quantum well.

In the first embodiment, each layer on the GaAs substrate is constructed of the AlGaAs system. During the heat treatment, the Ga atoms are absorbed by the dielectric film formed on the wafer surface located in the vicinity of the resonator end surface, and the velocity of diffusion of the Ga holes generated thereby is especially fast in AlGaAs. Therefore, the bandgap of the window region of the active layer can be largely changed and increased by the diffusion of the Ga holes into the active layer. As described above, to employ AlGaAs is effective for the restraint of the end surface deterioration by the present fabricating method and is excellent in improving the reliability.

In the first embodiment, there has been described the formation of the window region only on the light-emitting end surface of the resonator end surface. However, besides this, there are similar end surface deterioration restraining effects when the window region is formed only on the end surface opposite to the resonator end surface or when the window region is formed on both end surfaces.

In the first embodiment, the current injection prevention layer of the first conductive type is formed on the ridge stripe of the region located in the vicinity of the resonator end surface. In the window region, the holes from the protection layer surface diffuse into the second clad layer and the active layer during the heat treatment. If a current is flowed through this window region, there occurs a compositional change or the diffusion of the impurity in accordance with the movement of the holes during electrification. By providing the current injection prevention layer, the movement of the holes is prevented, producing an effect for improving the reliability.

FIRST COMPARATIVE EXAMPLE

As the first comparative example, a wafer was fabricated without the process of applying ions onto the wafer surface located on the p-type GaAs protection layer 107 side of the resonator internal region (FIG. 2C) and with the RTA process. The window region 113 and the internal region 114 of the wafer were subjected to the measurement of the PL peak wavelengths by the PL method. As a result, the peak wavelength of the PL of the window region 113 was 745 nm, and the peak wavelength of the PL of the internal region 114 was 760 nm. The PL wavelength of the window region 113 is shifted in wavelength to the shorter wavelength side only by 15 nm from the PL wavelength of the internal region 114. This quantitatively indicates the effect of the process of ion irradiation.

SECOND COMPARATIVE EXAMPLE

Figure 14:
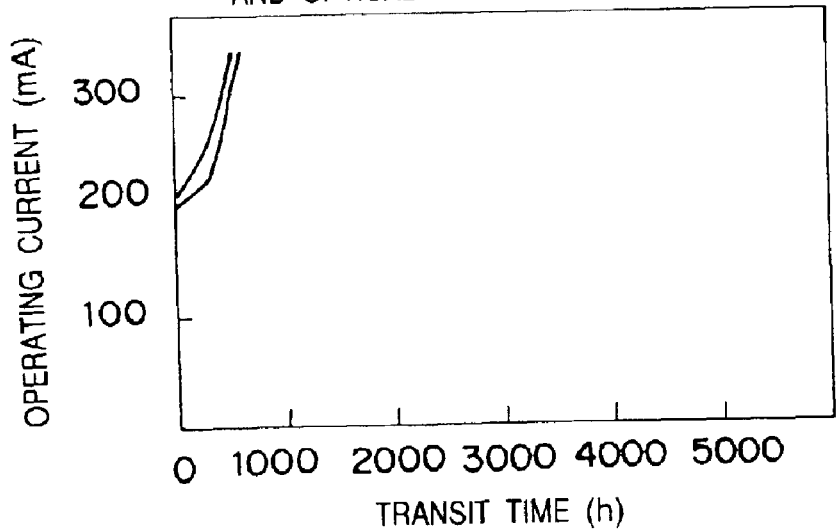
FIG. 14 is a graph showing a change in a drive current with respect to the transit time of the semiconductor laser element of the second comparative example of the present invention.

As the second comparative example, a semiconductor laser element was fabricated without the ion irradiation process. The oscillation wavelength of the semiconductor laser element became 770 nm with respect to the set wavelength of 785 nm with an optical output CW of 120 mW, and this meant that the wavelength was shortened by 15 nm from the set value. Furthermore, as shown in FIG. 14, there was observed such an element deterioration that the operating current increased in about 500 hours at an ambient temperature of 70° C. with an optical output CW of 120 mW. As described above, in the laser element of the second comparative example, the oscillation wavelength fluctuates in accordance with the bandgap fluctuation of the active layer inside the resonator, and the oscillation wavelength conforming to the setting cannot be achieved. Moreover, in accordance with the shortening of the oscillation wavelength, the element deterioration that the operating current is increased with a high output power tends to easily occur due to the reduction in the luminous efficiency because of the absorption in the window region and due to the leak of the carriers implanted in the active layer toward the clad layer, causing a problem in the long-term reliability.

Second Embodiment

Figure 3A:
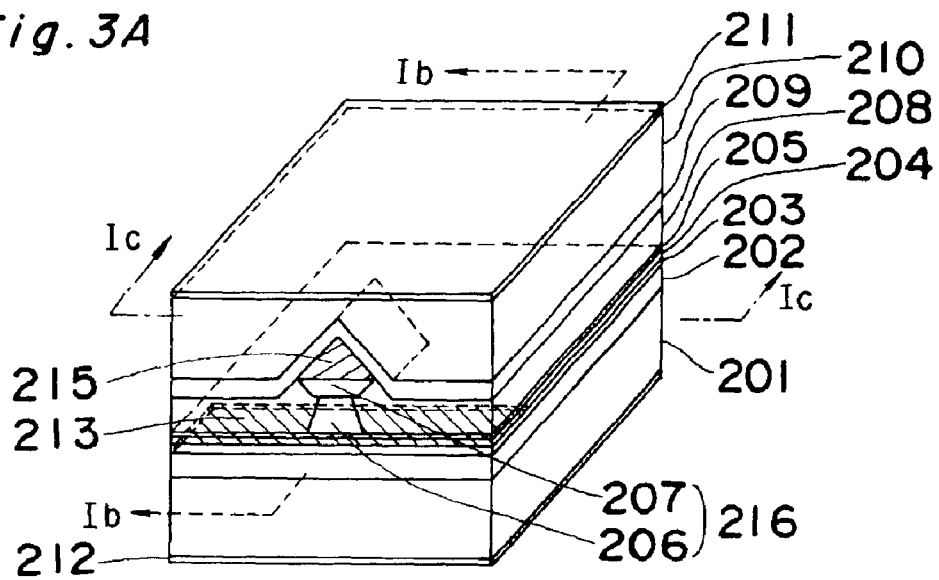
FIGS. 3A through 3C are a perspective view and sectional views showing the structure of a semiconductor laser element according to a second embodiment of the present invention.
Figure 3B:
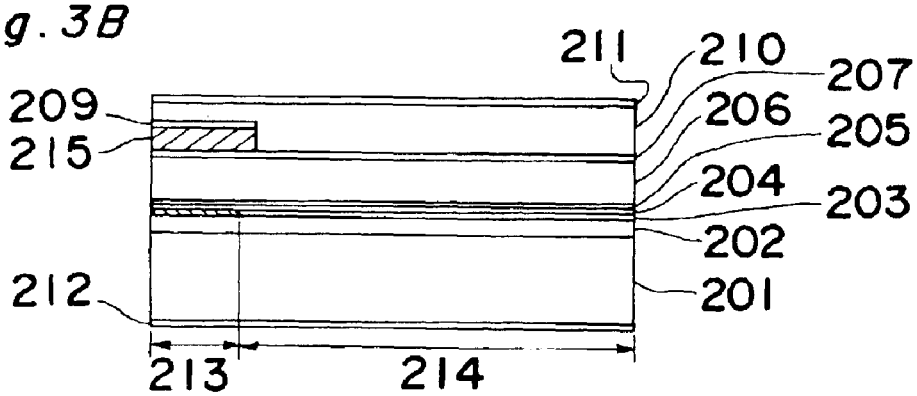
Figure 3C:
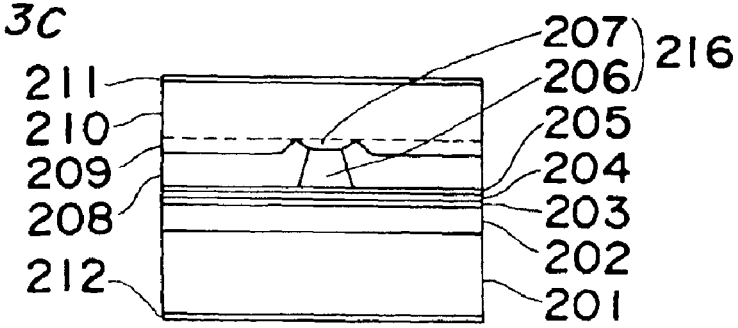

FIGS. 3A through 3C are sectional views showing the structure of a semiconductor laser element according to the second embodiment of the present invention. Regarding FIGS. 3A through 3C, FIG. 3A is a perspective view including a light-emitting end surface, FIG. 3B is a sectional view of a waveguide taken along the line Ib—Ib in FIG. 3A, and FIG. 3C is a sectional view taken in the direction of layer thickness along the line Ic—Ic in FIG. 3A.

There are provided an n-type GaAs substrate 201, an n-type $Al_{x2}Ga_{1-x2}As$ (x2 is greater than zero and not greater than one) first clad layer 202, a multiple quantum well active layer (MQW active layer) 203 in which a multiple quantum well structure obtained by alternately laminating barrier layers and well layers is interposed between optical guide layers, a p-type $Al_{x2}Ga_{1-x2}As$ second clad layer 204, a p-type GaAs etching stop layer 205, a p-type $Al_{x2}Ga_{1-x2}As$ third clad layer 206 constructed of a ridge stripe that extends in the direction of a resonator, a p-type GaAs protection layer 207, an n-type $Al_{y2}Ga_{1-y2}As$ (y2 is greater than zero and not greater than one) current block layer 208 formed so as to bury the side surfaces of the p-type $Al_{x2}Ga_{1-x2}As$ third clad layer 206 constructed of the ridge stripe and the p-type GaAs protection layer 207, a p-type GaAs flattening layer 209, a p-type GaAs contact layer 210, a p-side electrode 211 and an n-side electrode 212. There are further provided a window region 213 in which the bandgap of the MQW active layer located in the vicinity of the resonator end surface is larger than the bandgap of the MQW active layer 203 located inside the resonator, an internal region 214 of the active layer, an n-type $Al_{y2}Ga_{1-y2}As$ current injection prevention layer 215 formed on the p-type GaAs protection layer 207 and a ridge stripe 216 constructed of the p-type $Al_{x2}Ga_{1-x2}As$ third clad layer 206 and the p-type GaAs protection layer 207.

Next, the fabricating method will be described with reference to FIGS. 4A through 4I. The n-type $Al_{x2}Ga_{1-x2}As$ first clad layer 202, the non-doped MQW active layer 203, the p-type $Al_{x2}Ga_{1-x2}As$ second clad layer 204, the p-type GaAs etching stop layer 205, the p-type $Al_{x2}Ga_{1-x2}As$ third clad layer 206 and the p-type GaAs protection layer 207 are successively epitaxially grown on the n-type GaAs substrate 201 by a first-time metal-organic chemical vapor deposition (MOCVD) method, obtaining a DH wafer (FIG. 4A).

Next, an $SiO_{z2}$ film (z2 is a real number close to two, and its thickness is 0.5 μm) 221, which is a stripe-shaped dielectric film of a width of 40 μm in a direction perpendicular to the ridge stripe, is formed by the sputtering method and the photolithographic method on the surface of the p-type GaAs protection layer 207 in a region located in the vicinity of the resonator end surface. The pitch of the stripe-shaped dielectric film 221 formed on the semiconductor wafer was set to 1600 μm, which is approximately two times the resonator length (FIG. 4B).

Next, ionized atoms 222 are applied (ion irradiation) to a surface that belongs to the resonator internal region and is located on the p-type GaAs protection layer 207 side. According to the second embodiment, oxygen (O) ions were used for the ion irradiation, and the ion irradiation energy was set to 500 eV. An ion assist vapor deposition system was used for the ion irradiation (FIG. 4C).

After the ion irradiation is performed, an $SiO_{z3}$ film 223 (z3 is a real number close to two, and its thickness is 0.2 μm) is formed by the same ion assist vapor deposition method on the surface of the dielectric film 221 in the region located in the vicinity of the resonator end surface and the surface of the p-type GaAs protection layer 207 that has undergone ion irradiation and located in the resonator internal region (FIG. 4D).

Next, by the heat treatment according to the RTA method, there is formed a window region 213 in which the bandgap of the MQW active layer located just below the $SiO_{z2}$ film 221 is greater than the bandgap of the MQW active layer of the resonator internal region. With regard to heat treatment conditions at this time, the temperature was raised from the room temperature to a temperature of 930° C. in 30 seconds, retained at the temperature of 930° C. for 60 seconds and thereafter cooled. As a result, the window region 213 and the internal region 214 were formed in the direction of the resonator (FIG. 4E).

Next, the dielectric films 221 and 223 formed on the surface of the p-type GaAs protection layer 207 are removed, and a stripe-shaped resist mask 224 that extends in the [011] direction on the p-type GaAs protection layer 207 is formed by using the normal photolithographic technology. By using the normal etching technology, the p-type GaAs protection layer 207 and the p-type $Al_{x2}Ga_{1-x2}As$ third clad layer 206 are processed into a stripe-shaped ridge 216 that has a width of 2 μm and extends in the [011] direction so as to reach the p-type etching stop layer 205 (FIG. 4F).

Next, the stripe-shaped resist mask 224 formed on the p-type GaAs protection layer 207 is removed, and the side surfaces of the ridge 216 constructed of the p-type GaAs protection layer 207 and the p-type $Al_{x2}Ga_{1-x2}As$ third clad layer 206 are buried in an n-type $Al_{y2}Ga_{1-y2}As$ current block layer 208 and a p-type GaAs flattening layer 209 by a second-time MOCVD method (FIG. 4G).

By using the normal photolithographic technology, a resist mask 225 is formed on the p-type GaAs flattening layer 209 formed on both sides of the ridge 216 and on the p-type GaAs flattening layer 209 formed on the ridge 216 within a range of 60 μm from the resonator end surface. By using the normal etching technology, the n-type AlGaAs current block layer 208 and the p-type GaAs flattening layer 209 located at the opening of the resist mask 225 are selectively removed (FIG. 4H).

The resist mask 225 formed on the p-type GaAs flattening layer 209 is removed, and a p-type GaAs contact layer 210 is formed by a third-time MOCVD method. In the vicinity of the resonator end surface, an n-type $Al_{y2}Ga_{1-y2}As$ current injection prevention layer 215 grown concurrently with the current block layer 208 is formed on the ridge stripe 216 (FIG. 4I).

Finally, a p-electrode 211 is formed on the upper surface and an n-electrode 212 is formed on the lower surface.

Subsequently, a scribe line is scribed at the approximate center of the current injection prevention layer 215 of the width of 60 μm, and the wafer is divided into a laser bar of the resonator length. $AlO_s$ coating is performed so that the resonator end surface having the window region comes to have a reflectance of 12%, and a multilayer film of $AlO_s$ and amorphous Si is coated so that the resonator end surface located on the other side comes to have a reflectance of 95%. By division into chips, an element that has a window region of about 20 μm and the current injection prevention layer of about 30 μm in the light-emitting end surface portion of the resonator of a length of 800 μm is fabricated.

Figure 15:
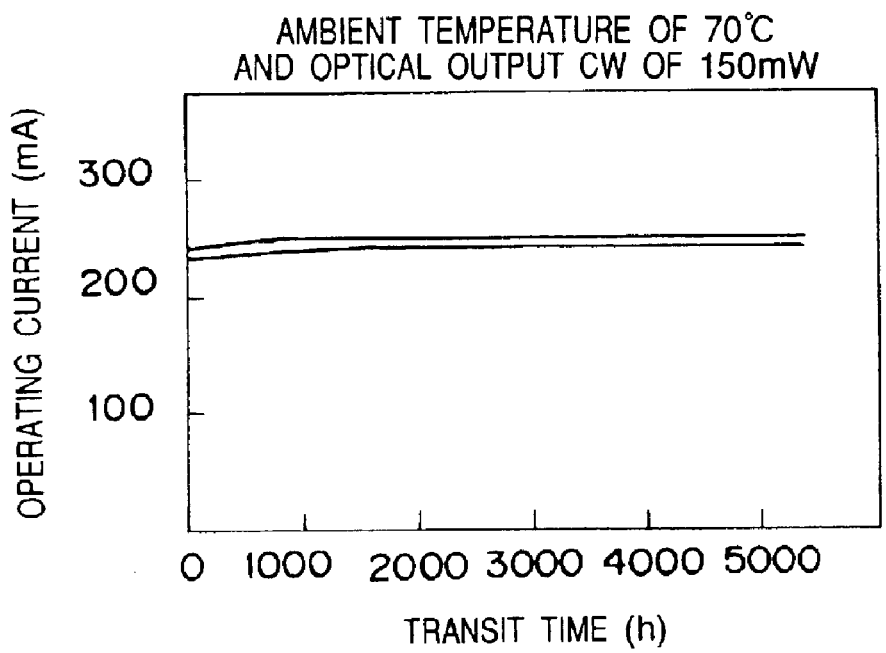
FIG. 15 is a graph showing a change in a drive current with respect to the transit time of the semiconductor laser element of the second embodiment of the present invention.

The characteristics of the semiconductor laser element obtained by the second embodiment of the present invention were evaluated. As a result, an oscillation wavelength of 785 nm conforming to the wavelength setting was obtained with an optical output CW of 120 mW by the element of the present invention. Furthermore, as shown in FIG. 15, the element stably operated with an optical output CW of 150 mW for 5,000 hours or more at an ambient temperature of 70° C., and no such deterioration phenomenon that the operating current increased in operation was observed.

The semiconductor laser element of the second embodiment of the present invention can prevent the occurrence of the bandgap fluctuation of the active layer inside the resonator, and therefore, the oscillation wavelength conforming to the setting can be achieved. Furthermore, it was clarified that the element had excellent long-term reliability when driven at high power.

It can be understood that the inclusion of the process of forming a dielectric film on the wafer surface inside the resonator before the heat treatment process produces additional effects in improving the reliability as indicated by the fabricating method of the present invention.

The dielectric film formed on the surface of the protection layer inside the resonator should properly be formed after the ionized atoms are applied. When the dielectric film is previously formed and thereafter the ionized atoms are applied, it is required to perform ion irradiation by accelerating the ion energy to an ion energy higher than 3 keV in order to generate the crystal defect on the surface of the protection layer of the wafer by making the ions pass through the dielectric film. In this case, the crystal defect intrudes from the surface of the protection layer of the wafer deep into the crystal, and the defect diffuses into the active layer during the heat treatment, degrading the reliability.

In the second embodiment, there has been described the use of the ion assist vapor deposition system as the ion irradiation system. The ion assist vapor deposition system is excellent in the point that the next dielectric film can be continuously formed without taking out the wafer into the atmosphere after the ion irradiation. Moreover, in the sputtering system and the plasma CVD system, the next dielectric film can be similarly continuously formed without exposing the wafer to the atmosphere after the ion irradiation, i.e., plasma irradiation. Furthermore, these systems are general systems in the semiconductor process and have the advantage that the fabricating method can be simplified.

Moreover, in the second embodiment, the dielectric film formed on the wafer surface in the region located in the vicinity of the resonator end surface and the dielectric film formed on the wafer surface in the resonator internal region are each made of an $SiO_x$ film and have almost identical thermal expansion coefficient. Since the wafer surfaces located in the vicinity of the resonator end surface and inside the resonator are covered with the dielectric films of almost identical thermal expansion coefficient, the distortion due to the difference in the thermal expansion coefficient between the resonator end surface and resonator interior through the heat treatment can be further reduced, producing an effect for improving the reliability.

Moreover, in the second embodiment, the film thickness of the dielectric film formed on the wafer surface in the region located in the vicinity of the resonator end surface is set so as to become thicker than the film thickness of the dielectric film formed on the wafer surface of the resonator internal region. The arrangement that the film thickness of the dielectric film located in the vicinity of the resonator end surface is thick enables the generation of a large amount of holes through the heat treatment and the diffusion of the holes into the active layer. Therefore, the increase in the bandgap of the window region of the active layer can be promoted. Concurrently, the arrangement that the film thickness of the dielectric film inside the resonator is thinner than in the vicinity of the resonator end surface enables the reduction in the number of holes to be generated through the heat treatment and the restraint of the diffusion of the holes into the internal region of the active layer. As described above, the reliability can be improved by the restraint of the end surface deterioration. The bandgap fluctuation of the internal region of the active layer inside the resonator can be concurrently restrained.

Moreover, in the second embodiment, the film thickness of the dielectric film formed on the wafer surface of the resonator internal region is not greater than 0.5 μm. When the film thickness is thicker than 0.5 μm, there is generated a large number of holes through the heat treatment. Therefore, it is unable to prevent the diffusion of holes into the active layer, and the bandgap fluctuation of the internal region of the active layer inside the resonator tends to easily occur.

Moreover, in the second embodiment, the length of the current injection prevention layer 215 located in the vicinity of the resonator end surface is longer than the length of the window region 213. The holes generated by the heat treatment on the surface of the protection layer diffuse into not only the active layer located just below but also the active layer inside the resonator. The holes diffused into the resonator do not significantly fluctuate the bandgap of the active layer but generate a minute defect in the active layer by the injected current. That is, when a current is flowed through the region, which belongs to the active layer and in which the holes have been diffused, there is observed a slight current increase during electrification. Accordingly, the current injection prevention layer 215 is set longer than the window region 213, so that no current is flowed through the region, which belongs to the internal region of the resonator and in which the holes have been diffused. With this arrangement, there can be obtained a laser element of excellent reliability over a long period of time.

Moreover, in the second embodiment, the oxygen ions are applied to the protection layer 207 of the internal region of the resonator. In this case, an oxide film of Ga or As sufficiently thinner than 0.2 μm is formed concurrently with the crystal defect in the vicinity of the protection layer surface, and the holes generated on the wafer surface during the heat treatment can be efficiently captured by both the crystal defect and the oxide film. This arrangement is, therefore, more suitable for the restraint of the diffusion of holes into the internal region of the active layer, i.e., the prevention of the bandgap fluctuation and the prevention of oscillation wavelength fluctuation.

THIRD COMPARATIVE EXAMPLE

Figure 16:
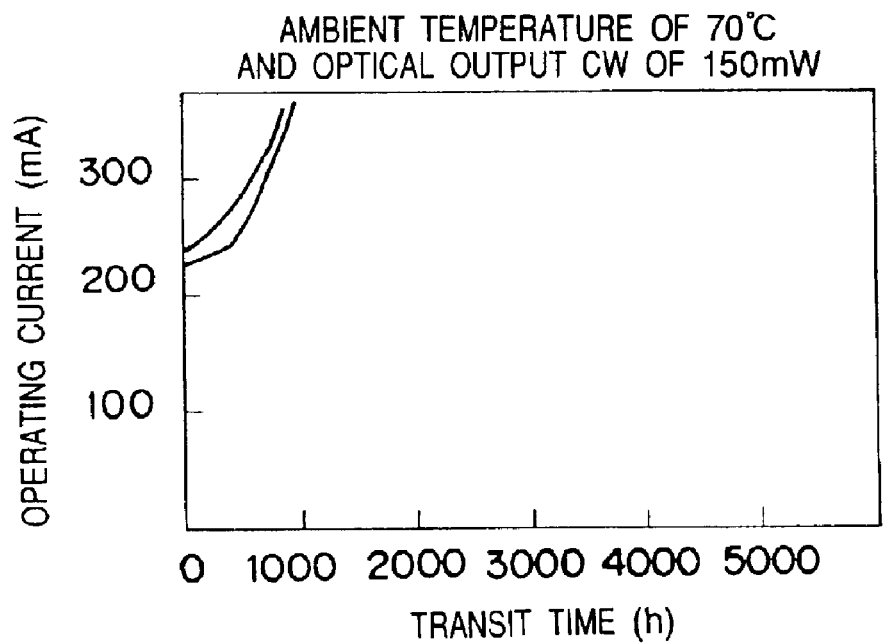
FIG. 16 is a graph showing a change in a drive current with respect to the transit time of the semiconductor laser element of the third comparative example of the present invention.
Figure 17A:
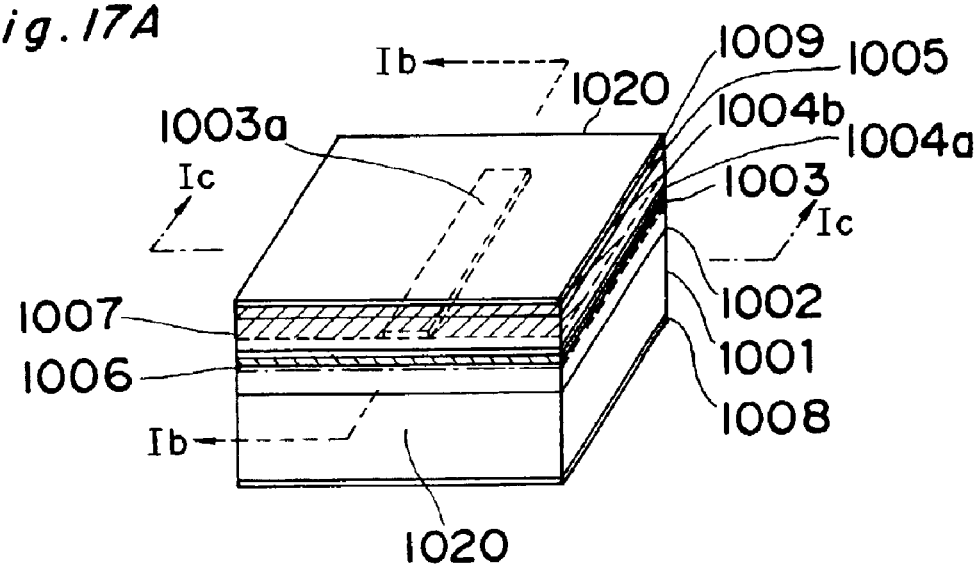
FIGS. 17A through 17C are a perspective view and sectional views showing the structure of a prior art semiconductor laser element.
Figure 17B:
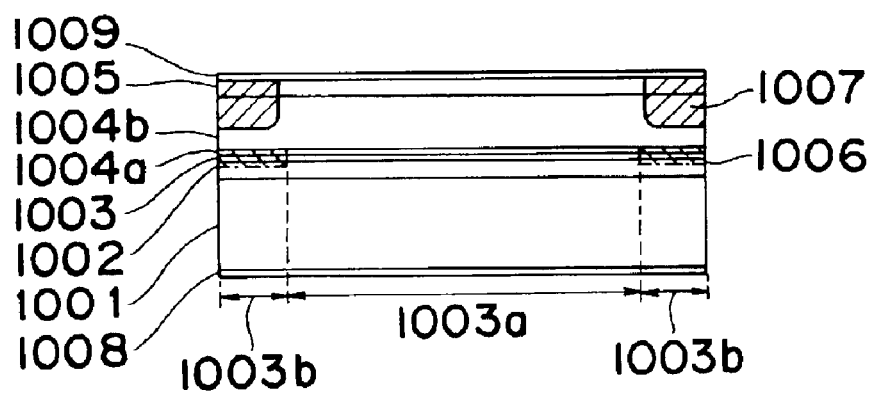
Figure 17C:
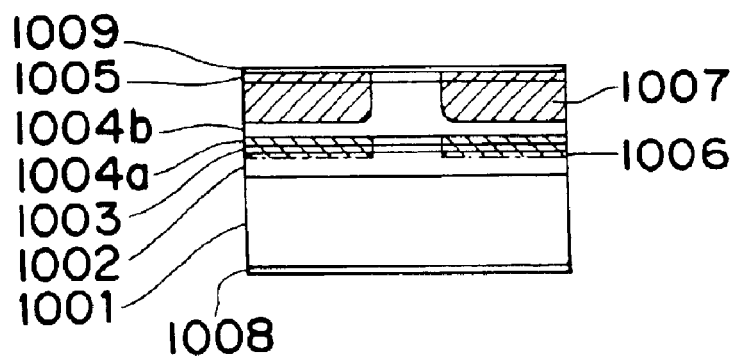
Figure 18A:
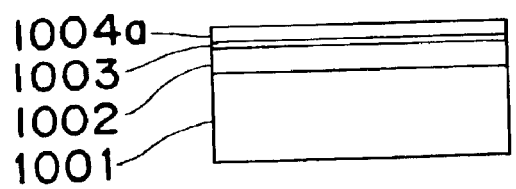
FIGS. 18A through 18D are views for explaining the semiconductor laser element fabricating method of the prior art.
Figure 18B:
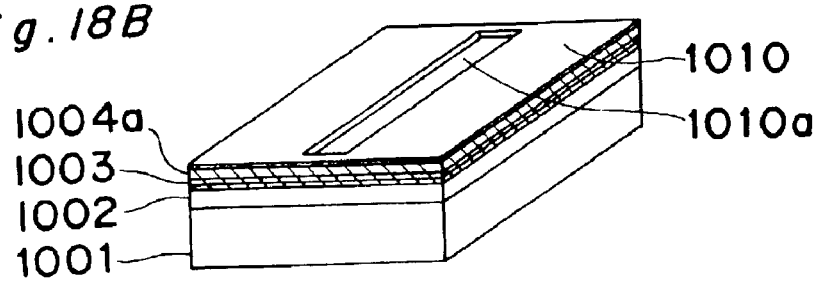
Figure 18C:
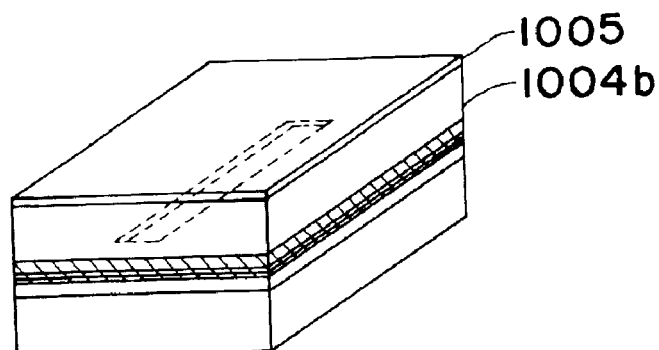
Figure 18D:
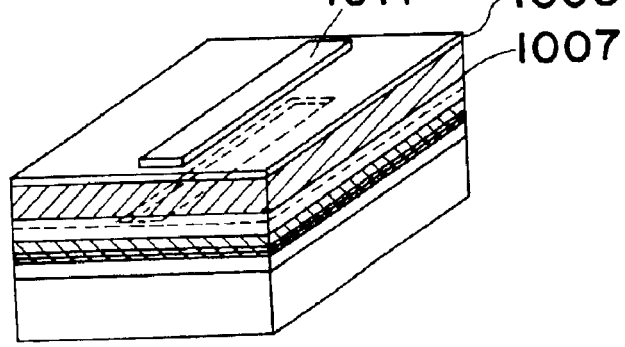

As the third comparative example, a semiconductor laser element was fabricated without the process of forming the dielectric film 223 on the wafer surface of FIG. 4D after applying the ionized atoms onto the surface of the p-type GaAs protection layer 207 inside the resonator and with the RTA process. The characteristics of the fabricated element were evaluated. As shown in FIG. 16, in the present semiconductor laser element, there was observed a deterioration phenomenon such that the operating current increased in about 1,000 hours at an ambient temperature of 70° C. with an optical output CW of 150 mW. It can be presumed that, if the heat treatment is performed without forming the dielectric film on the surface of the protection layer inside the resonator, then a distortion due to the difference in the thermal expansion coefficient between the end surface and the inside of the resonator during the heat treatment, and the distortion takes effect on the active layer (internal region), degrading the long-term reliability.

Third Embodiment

FIGS. 5A through 5C are sectional views showing the structure of a semiconductor laser element according to the third embodiment of the present invention. Regarding FIGS. 5A through 5C, FIG. 5A is a perspective view including a light-emitting end surface, FIG. 5B is a sectional view of a waveguide taken along the line Ib—Ib in FIG. 5A, and FIG. 5C is a sectional view taken in the direction of layer thickness along the line Ic—Ic in FIG. 5A.

There are provided an n-type GaAs substrate 301, an n-type $Al_{x3}Ga_{1-x3}As$ (x3 is greater than zero and not greater than one) first clad layer 302, a multiple quantum well active layer (MQW active layer) 303 in which a multiple quantum well structure obtained by alternately laminating barrier layers and well layers is interposed between optical guide layers, a p-type $Al_{x3}Ga_{1-x3}As$ second clad layer 304, a p-type GaAs etching stop layer 305, a p-type $Al_{x3}Ga_{1-x3}As$ third clad layer 306 constructed of a ridge stripe that extends in the direction of a resonator, a p-type GaAs protection layer 307, an n-type $Al_{y3}Ga_{1-y3}As$ (y3 is greater than zero and not greater than one) current block layer 308 formed so as to bury the side surfaces of the p-type $Al_{x3}Ga_{1-x3}As$ third clad layer constructed of the ridge stripe, a p-type GaAs flattening layer 309, a p-type GaAs contact layer 310, a p-side electrode 311 and an n-side electrode 312. The thickness of the p-type GaAs protection layer 307 is made thicker in the region located in the vicinity of the resonator end surface than in the resonator internal region.

The multiple quantum well active layer (MQW active layer) 303 is constructed of a window region 313 and an internal region 314. The window region 313 is a region in which the bandgap is larger than the bandgap of the internal region 314, while the internal region 314 is a region that has a gain for achieving laser oscillation. There are further provided an n-type $Al_{y3}Ga_{1-y3}As$ current injection prevention layer 315 formed on the p-type GaAs protection layer 307 and a ridge stripe 316 constructed of the p-type $Al_{x3}Ga_{1-x3}As$ third clad layer 306 and the p-type GaAs protection layer 307. Moreover, as described in connection with the following fabricating method, this window region 313 is formed by applying ionized atoms from the surface of the second conductive type protection layer 307 side and thereafter performing the RTA, or the heat treatment for heating with a temperature rise in a short time.

The fabricating method of the semiconductor laser element of the third embodiment of the present invention will be described with reference to FIGS. 6A through 6I. The n-type $Al_{x3}Ga_{1-x3}As$ first clad layer 302, the non-doped MQW active layer 303, the p-type $Al_{x3}Ga_{1-x3}As$ second clad layer 304, the p-type GaAs etching stop layer 305, the p-type $Al_{x3}Ga_{1-x3}As$ third clad layer 306 and the p-type GaAs protection layer 307 are successively epitaxially grown on the n-type GaAs substrate 301 by a first-time metal-organic chemical vapor deposition (MOCVD) method, obtaining a DH wafer (FIG. 6A).

An $SiN_{t1}$ film (t1 is a real number close to 4/3, and its thickness is 0.5 μm) 321 of a width of 50 μm is formed in a stripe shape in a direction perpendicular to the ridge stripe by the plasma CVD method and the photolithographic method on the surface of the p-type GaAs protection layer 307 in the region located in the vicinity of the resonator end surface. The pitch of the stripe was set to 1200 μm, which is approximately two times the resonator length (FIG. 6B).

Next, ionized atoms 322 are applied (ion irradiation) to the wafer surface that belongs to the resonator internal region and is located on the p-type GaAs protection layer 307 side. According to the present embodiment, mixed gas ions of argon (Ar) ions and oxygen (O) ions were used, and the ion irradiation energy was set to 800 eV. A plasma CVD system was used for the ion irradiation (FIG. 6C). The ion energy is approximately equal to a voltage applied across the opposite electrodes of the plasma CVD system.

Since the ion irradiation was performed by using plasma, the p-type GaAs protection layer 307 that was located in the resonator internal region and not covered with the $SiN_{t1}$ film 321 was etched by about 0.1 μm. An $SiN_{t2}$ film 323 (t2 is a real number close to 4/3, and its thickness is 0.2 μm) is formed by the plasma CVD method on the surface of the dielectric film 321 in the region located in the vicinity of the resonator end surface and on the surface of the p-type GaAs protection layer 307 that belongs to the resonator internal region and has undergone ion irradiation (FIG. 6D).

Next, the window region 313 in which the bandgap of the MQW active layer located just below the $SiN_{t1}$ film 321 is larger than the bandgap of the MQW active layer located in the resonator internal region is formed by the heat treatment according to the RTA method. With regard to heat treatment conditions at this time, the temperature was raised from the room temperature to a temperature of 950° C. in 60 seconds and retained for 80 seconds. As a result, the window region 313 and the internal region 314 were formed in the direction of the resonator in the active layer 303 (FIG. 6E).

Next, the dielectric films 321 and 323 formed on the surface of the p-type GaAs protection layer 307 are removed, and a stripe-shaped resist mask 324 that extends in the [011] direction on the p-type GaAs protection layer 307 is formed by using the normal photolithographic technology. By using the normal etching technology, the p-type GaAs protection layer 307 and the p-type $Al_{x3}Ga_{1-x3}As$ third clad layer 306 are processed into a stripe-shaped ridge 316 that has a width of 3 μm and extends in the [011] direction so as to reach the p-type etching stop layer 305 (FIG. 6F).

Next, the stripe-shaped resist mask 324 formed on the p-type GaAs protection layer 307 is removed, and the side surfaces of the ridge stripe 316 constructed of the p-type GaAs protection layer 307 and the p-type $Al_{x3}Ga_{1-x3}As$ third clad layer 306 are buried in an n-type $Al_{y3}Ga_{1-y3}As$ current block layer 308 and a p-type GaAs flattening layer 309 by a second-time MOCVD method (FIG. 6G).

By using the normal photolithographic technology, a stripe-shaped resist mask 325 of a width of 50 μm is formed on the p-type GaAs flattening layer 309 formed on both sides of the ridge 316 and the p-type GaAs flattening layer 309 formed on the ridge 316. At this time, the thickness of the p-type GaAs protection layer 307 located just above the window region 313 becomes thicker than the thickness of the p-type GaAs protection layer 307 located inside the resonator. Then, a difference in level is generated on the surfaces of the p-type GaAs flattening layer 309. With the difference in level used as a mark, only the p-type GaAs flattening layer 309 located just above the window region is covered with a resist, and a resist mask 325 that has a resist opening above the ridge other than the above-mentioned portion is formed. By the normal etching technology, the n-type $Al_{y3}Ga_{1-y3}As$ current block layer 308 and the p-type GaAs flattening layer 309 located at the opening of the resist mask 325 are selectively-removed (FIG. 6H).

The resist mask 325 formed on the p-type GaAs flattening layer 309 is removed, and a p-type GaAs contact layer 310 is formed by a third-time MOCVD method. In the vicinity of the resonator end surface, an n-type $Al_{y3}Ga_{1-y3}As$ current injection prevention layer 315 formed concurrently with the current block layer 308 is formed on the ridge 316 (FIG. 6I).

Further, a p-electrode 311 is formed on the upper surface, and an n-electrode 312 is formed on the lower surface. Then, a scribe line is scribed in the current injection prevention layer of the width of 50 μm, i.e., at the approximate center of the window region, and the wafer is divided into a laser bar of the resonator length. $AlO_s$ coating is performed so that the resonator end surface having the window region comes to have a reflectance of 12%, and a multilayer film of $AlO_s$ and amorphous Si is coated so that the resonator end surface located on the other side comes to have a reflectance of 95%. By division into chips, a semiconductor laser element that had a window region of about 25 μm and the current injection prevention layer of about 25 μm in the light-emitting end surface portion of the resonator of a length of 600 μm was fabricated.

The characteristics of the semiconductor laser element obtained by the semiconductor laser element fabricating method of the third embodiment of the present invention were evaluated. As a result, an oscillation wavelength of 785 nm conforming to the wavelength setting was obtained with an optical output CW of 120 mW by the semiconductor laser element of the present invention. Furthermore, the element stably operated with an optical output CW of 150 mW for 5,000 hours or more at an ambient temperature of 70° C., and no such deterioration phenomenon that the operating current increased in operation was observed.

According to the third embodiment of the present invention, the atoms ionized by the plasma are generated and applied onto the surface of the protection layer of the resonator internal region, and therefore, the surface of the protection layer is also etched by this plasma. The contaminant and the surface oxide film that adhere to the surface can be removed by this etching of the protection layer surface, and the generation of the crystal defect on the protection layer surface is promoted by the irradiation of the ionized atoms. This crystal defect captures the holes generated on the protection layer surface during the RTA and prevents the holes from diffusing in the direction of the n-type GaAs substrate and from disordering the active layer. By this operation, the bandgap fluctuation of the active layer of the internal region can be prevented.

Moreover, in the third embodiment, the thickness of the protection layer 307 located just above the window region is thicker than the thickness of the protection layer 307 located inside the resonator. Therefore, by using the above arrangement as a mark, it is possible to align in position the mask for forming the first conductive type current injection prevention layer 315. Therefore, the positional alignment can be achieved comparatively easily, and this enables the simplification of the end surface forming process with excellent mass-productivity.

In the third embodiment, there has been described use of the plasma CVD system as the ion irradiation system. By using this system, the next dielectric film can be continuously formed without taking out the wafer obtained after the ion irradiation into the atmosphere nor exposing the wafer obtained after the ion irradiation to the atmosphere. Furthermore, these systems are general systems in the semiconductor process and have the advantage that the fabricating method can be simplified. The sputtering system has a similar effect.

Fourth Embodiment

Figure 7A:
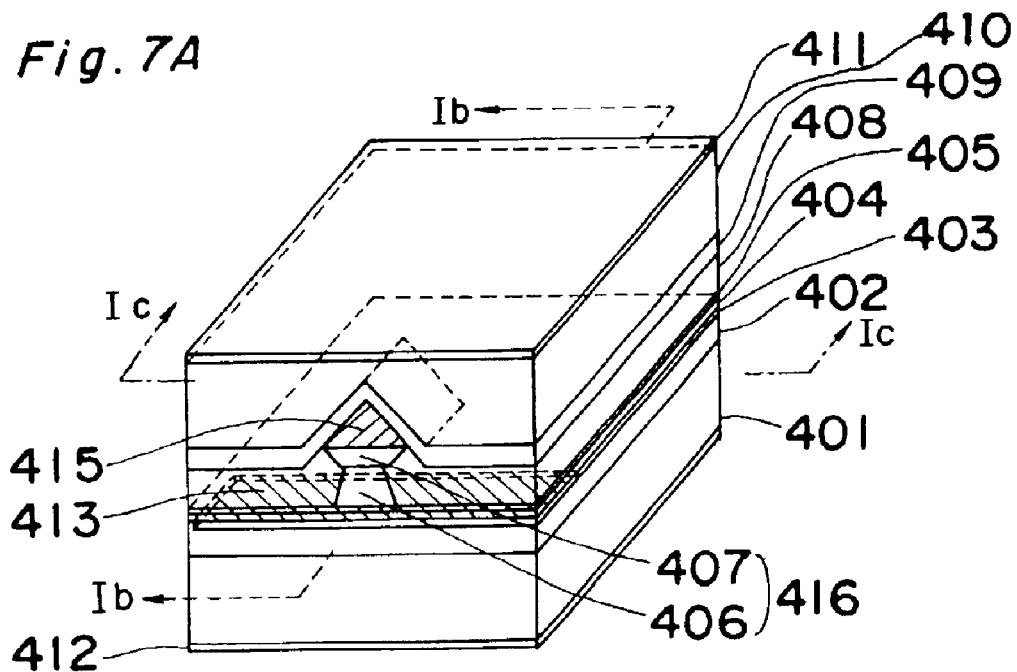
FIGS. 7A through 7C are a sectional views showing the structure of a semiconductor laser element according to a fourth embodiment of the present invention.
Figure 7B:
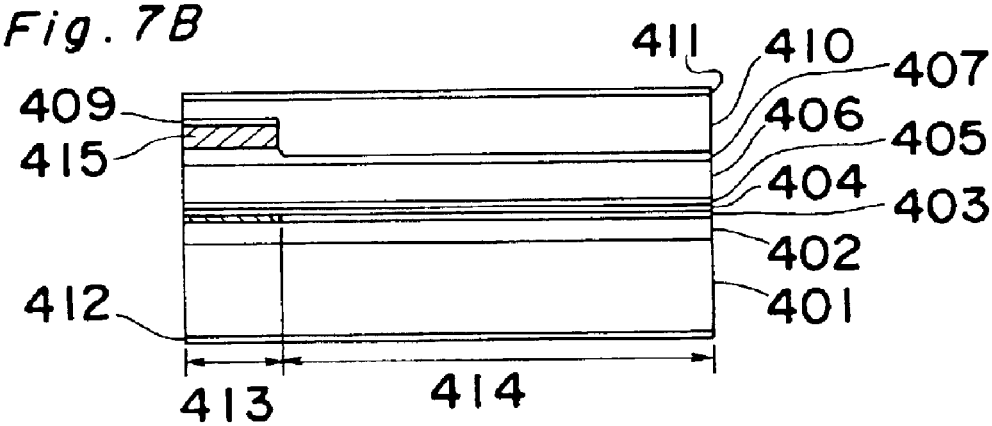
Figure 7C:
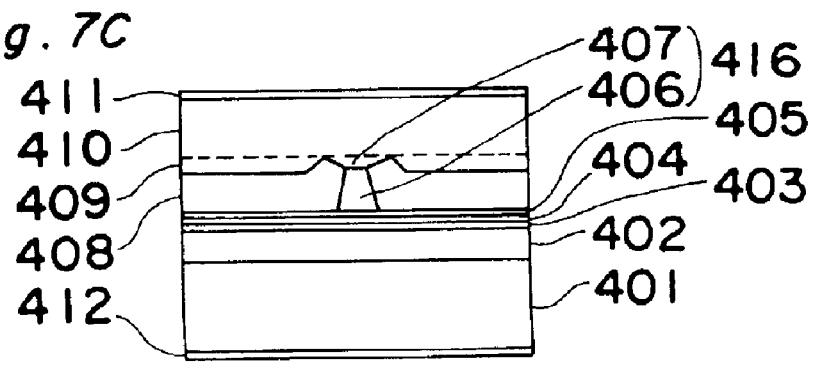

FIGS. 7A through 7C are sectional views showing the structure of a semiconductor laser element according to the fourth embodiment of the present invention. Regarding FIGS. 7A through 7C, FIG. 7A is a perspective view including a light-emitting end surface, FIG. 7B is a sectional view of a waveguide taken along the line Ib—Ib in FIG. 7A, and FIG. 7C is a sectional view taken in the direction of layer thickness along the line Ic—Ic in FIG. 7A.

There are provided an n-type GaAs substrate 401, an n-type $Al_{x4}Ga_{1-x4}As$ (x4 is greater than zero and not greater than one) first clad layer 402, a multiple quantum well active layer (MQW active layer) 403 in which a multiple quantum well structure obtained by alternately laminating barrier layers and well layers is interposed between optical guide layers, a p-type $Al_{x4}Ga_{1-x4}As$ second clad layer 404, a p-type etching stop layer 405, a p-type $Al_{x4}Ga_{1-x4}As$ third clad layer 406 constructed of a ridge stripe that extends in the direction of a resonator, a p-type GaAs protection layer 407, an n-type $Al_{y4}Ga_{1-y4}As$ (y4 is greater than zero and not greater than one) current block layer 408 formed so as to bury the side surfaces of the p-type $Al_{x4}Ga_{1-x4}As$ third clad layer constructed of the ridge stripe, a p-type GaAs flattening layer 409, a p-type GaAs contact layer 410, a p-side electrode 411 and an n-side electrode 412. The thickness of the p-type GaAs protection layer 407 is made thicker in the region located in the vicinity of the resonator end surface than in the resonator internal region.

The multiple quantum well active layer (MQW active layer) 403 is constructed of a window region 413 and an internal region (alternatively referred to as an active region) 414. The window region 413 is a region in which the bandgap is larger than the bandgap of the internal region 414, while the internal region 414 is a region that has a gain for achieving laser oscillation. There are further provided an n-type $Al_{y4}Ga_{1-y4}As$ current injection prevention layer 415 formed on the p-type GaAs protection layer 407 and a ridge stripe 416 constructed of the p-type $Al_{x4}Ga_{1-x4}As$ third clad layer 406 and the p-type GaAs protection layer 407.

In the semiconductor laser element of the fourth embodiment of the present invention, the stripe width of the ridge stripe 416 in the region located in the vicinity of the resonator end surface is made wider than the stripe width of the ridge stripe of the internal region 414 of the resonator.

The fabricating method of the semiconductor laser element of the fourth embodiment of the present invention will be described with reference to FIGS. 8A through 8I. The n-type $Al_{x4}Ga_{1-x4}As$ first clad layer 402, the non-doped MQW active layer 403, the p-type $Al_{x4}Ga_{1-x4}As$ second clad layer 404, the p-type GaAs etching stop layer 405, the p-type $Al_{x4}Ga_{1-x4}As$ third clad layer 406 and the p-type GaAs protection layer 407 are successively epitaxially grown on the n-type GaAs substrate 401 by a first-time metal-organic chemical vapor deposition (MOCVD) method, obtaining a DH wafer (FIG. 8A)

A dielectric $SiO_{z3}$ film (z3 is a real number close to two, and its thickness is 0.5 μm) 421 of a width of 40 μm is formed in a stripe shape in a direction perpendicular to the ridge stripe by the plasma CVD method and the photolithographic method on the surface of the p-type GaAs protection layer 407 in the region located in the vicinity of the resonator end surface. The pitch of the stripe was set to 1600 μm, which is approximately two times the resonator length (FIG. 8B).

Next, ionized atoms 422 are applied (ion irradiation) onto the wafer surface that belongs to the resonator internal region and is located on the p-type GaAs protection layer 407 side. According to the fourth embodiment of the present invention, nitrogen (N) ion gas was used, and the ion energy was conditioned to be set to 1000 eV. A sputtering system was used for the ion irradiation (FIG. 8C). The ion energy is approximately equal to a voltage applied across the opposite electrodes of the sputtering system.

Since the ion irradiation was performed by using plasma, the p-type GaAs protection layer 407 that is located in the resonator internal region and not covered with the $SiO_{z3}$ film 421 was etched by about 0.1 μm. According to the semiconductor laser element fabricating method of the fourth embodiment of the present invention, although the ion energy is small, the amount of etching is large since no oxide film its formed. An $SiO_{z4}$ film 423 (z4 is a real number close to two, and its thickness is 0.3 μm) is formed by the sputtering method on the surface of the dielectric film 421 in the region located in the vicinity of the resonator end surface and on the surface of the p-type GaAs protection layer 407 that belongs to the resonator internal region and has undergone ion irradiation (FIG. 8D).

Next, the window region 413 in which the bandgap of the MQW active layer located just below the $SiO_{z3}$ film 421 is larger than the bandgap of the MQW active layer located in the resonator internal region is formed by the heat treatment according to the RTA method. With regard to heat treatment conditions at this time, the temperature was raised from the room temperature to a temperature of 950° C. in 60 seconds and retained for 60 seconds. As a result, the window region 413 and the internal region 414 were formed in the direction of the resonator in the active layer 403 (FIG. 8E).

Next, the dielectric films 421 and 423 formed on the surface of the p-type GaAs protection layer 407 are removed, and a stripe-shaped resist mask 424 that extends in the [011] direction on the p-type GaAs protection layer 407 is formed by using the normal photolithographic technology. By using the normal etching technology, the p-type GaAs protection layer 407 and the p-type $Al_{x4}Ga_{1-x4}As$ third clad layer 406 are processed into a stripe-shaped ridge 416 that has a width of 2.5 μm and extends in the [011] direction so as to reach the p-type etching stop layer 405. At this time, the thickness of the layer including the p-type etching stop layer, the p-type GaAs protection layer 407 and the p-type AlGaAs clad layer 406 is thicker in the window region of the resonator end surface than in the resonator internal region. Therefore, the width of the ridge becomes wider in the region located in the vicinity of the resonator end surface (resonator window region) than in the resonator internal region when the protection layer 407 and the clad layer 406 are etched by chemical etching (FIG. 8F).

Next, the stripe-shaped resist mask 424 formed on the p-type GaAs protection layer 407 is removed, and the side surfaces of the ridge 416 constructed of the p-type GaAs protection layer 407 and the p-type $Al_{x4}Ga_{1-x4}As$ third clad layer 406 are buried in an n-type $Al_{y4}Ga_{1-y4}As$ current block layer 408 and a p-type GaAs flattening layer 409 by a second-time MOCVD method (FIG. 8G).

By using the normal photolithographic technology, a stripe-shaped resist mask 425 of a width of 60 μm is formed on the p-type GaAs flattening layer 409 formed on both sides of the ridge 416 and the p-type GaAs flattening layer 409 formed on the ridge 416. At this time, the thickness of the p-type GaAs protection layer 407 opposite to the window region 413 becomes thicker than the thickness of the p-type GaAs protection layer 407 inside the resonator. Then, a difference in level is generated on the surface of the p-type GaAs flattening layer 409. With the difference in level used as a mark, only the p-type GaAs flattening layer 409 opposite to the window region 413 is covered with a resist, and a resist mask 425 that has an opening at the ridge opposite to the internal region is formed. By the normal etching technology, the n-type $Al_{y4}Ga_{1-y4}As$ current block layer 408 and the p-type GaAs flattening layer 409 located at the opening of the resist mask 425 are selectively removed (FIG. 8H).

The resist mask 425 formed on the p-type GaAs flattening layer 409 is removed, and a p-type GaAs contact layer 410 is formed by a third-time MOCVD method. In the vicinity of the resonator end surface, an n-type $Al_{y4}Ga_{1-y4}As$ current injection prevention layer 415 formed concurrently with the current block layer 408 is formed on the ridge 416 (FIG. 8I).

Further, a p-electrode 411 is formed on the upper surface, and an n-electrode 412 is formed on the lower surface.

Next, a scribe line is scribed in the current injection prevention layer of the width of 60 μm, i.e., at the approximate center of the window region, and the wafer is divided into a laser bar of the resonator length. $AlO_x$ coating is performed so that the resonator end surface having the window region comes to have a reflectance of 12%, and a multilayer film of $AlO_x$ and amorphous Si is coated so that the resonator end surface located on the other side comes to have a reflectance of 95%. By division into chips, a semiconductor laser element that has a window region of about 30 μm and the current injection prevention layer in the light-emitting end surface portion of the resonator of a length of 800 μm is fabricated.

The characteristics of the semiconductor laser element of the fourth embodiment of the present invention were evaluated. As a result, an oscillation wavelength of 785 nm conforming to the wavelength setting was obtained with an optical output CW of 120 mW by the semiconductor laser element of the present invention. Furthermore, the element stably operated with an optical output CW of 150 mW for 10000 hours or more at an ambient temperature of 70° C., and no such deterioration phenomenon that the operating current was increased in operation was observed.

In the semiconductor laser element of the fourth embodiment, the stripe width of the window region is wider than the stripe width of the internal region. When the stripe width is wide, the light density inside the stripe can be reduced. Therefore, the present invention, which can reduce the light density inside the stripe of the window region, is more effective in restraining the end surface deterioration and effective for improving the long-term reliability. Moreover, since the stripe width of the internal region of the resonator can be narrowed. Therefore, the transverse mode of the laser can be stabilized, and the kink can be prevented from appearing in the I-L characteristic.

According to the fabricating method of the fourth embodiment of the present invention, a structure in which the stripe width of the region located in the vicinity of the resonator end surface is selectively widened can be fabricated in a self-aligned manner during the window forming process. Therefore, the fabricating process can be simplified.

Fifth Embodiment

Figure 9A:
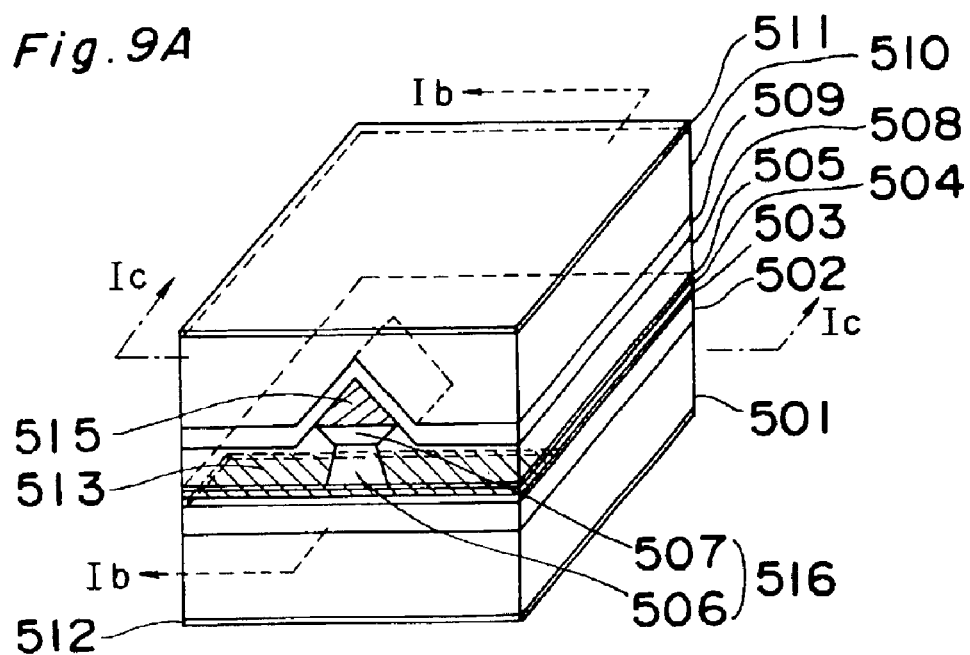
FIGS. 9A through 9C are a perspective view and sectional views showing the structure of a semiconductor laser element according to a fifth embodiment of the present invention.
Figure 9B:
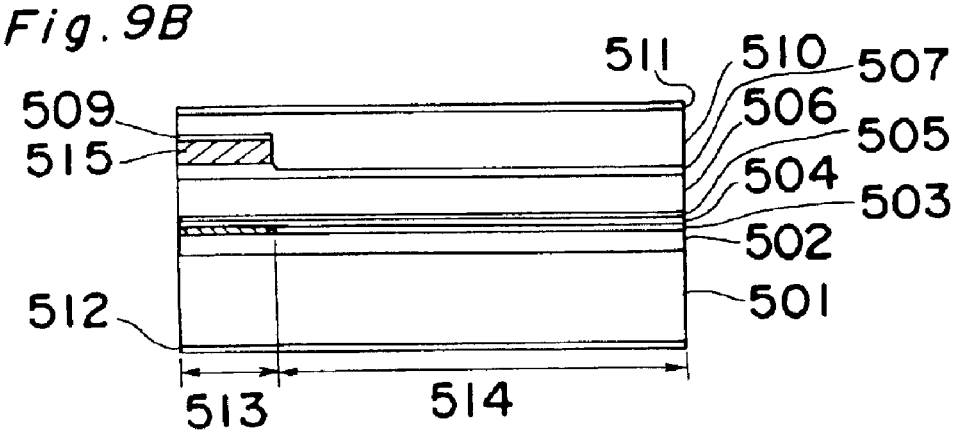
Figure 9C:
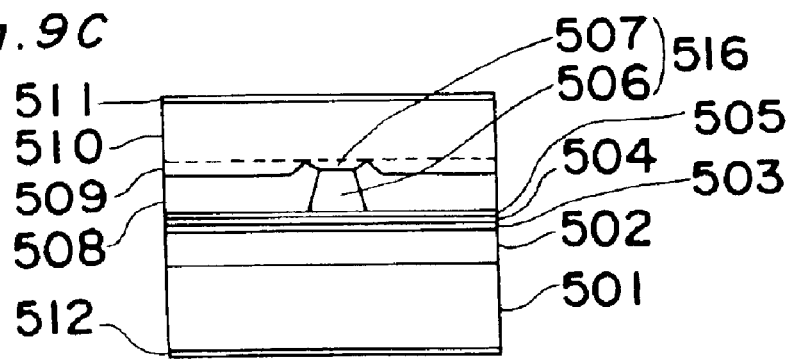

FIGS. 9A through 9C are sectional views showing the structure of a semiconductor laser element according to the fifth embodiment of the present invention. Regarding FIGS. 9A through 9C, FIG. 9A is a perspective view including a light-emitting end surface, FIG. 9B is a sectional view of a waveguide taken along the line Ib—Ib in FIG. 9A, and FIG. 9C is a sectional view taken in the direction of layer thickness along the line Ic—Ic in FIG. 9A.

There are provided an n-type GaAs substrate 501, an n-type $Al_{x5}Ga_{1-x5}As$ (x5 is greater than zero and not greater than one) first clad layer 502, a multiple quantum well active layer (MQW active layer) 503 in which a multiple quantum well structure obtained by alternately laminating barrier layers and well layers is interposed between optical guide layers, a p-type $Al_{x5}Ga_{1-x5}As$ second clad layer 504, a p-type GaAs etching stop layer 505, a p-type $Al_{x5}Ga_{1-x5}As$ third clad layer 506 constructed of a ridge stripe that extends in the direction of a resonator, a p-type GaAs protection layer 507, an n-type $Al_{y5}Ga_{1-y5}As$ (y5 is greater than zero and not greater than one) current block layer 508 formed so as to bury the side surfaces of the p-type $Al_{x5}Ga_{1-x5}As$ third clad layer constructed of the ridge stripe, a p-type GaAs flattening layer 509, a p-type GaAs contact layer 510, a p-side electrode 511 and an n-side electrode 512.

There are further provided a window region 513 in which the bandgap of the MQW active layer located in the vicinity of the resonator end surface is larger than the bandgap of the MQW active layer 503 located inside the resonator, an internal region 514 of the resonator, an n-type $Al_{y5}Ga_{1-y5}As$ current injection prevention layer 515 formed on the p-type GaAs protection layer 507 and a ridge stripe 516 constructed of the p-type $Al_{x5}Ga_{1-x5}As$ third clad layer 506 and the p-type GaAs protection layer 507.

Figure 11:
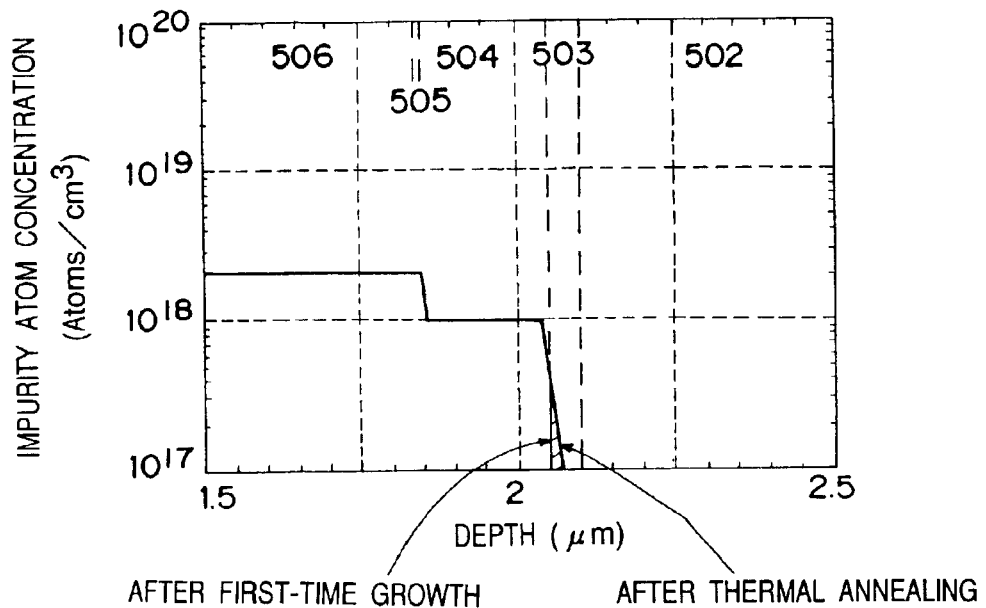
FIG. 11 is a graph of a p-type impurity atom concentration distribution in the window region of the semiconductor laser element of the fifth embodiment of the present invention.

FIG. 11 shows the impurity atom concentration distribution of the group-II atom (Zn) that is the p-type impurity in the p-type $Al_{x5}Ga_{1-x5}As$ third clad layer 506, the p-type GaAs etching stop layer 505, the p-type $Al_{x5}Ga_{1-x5}As$ second clad layer 504, the MQW active layer 503 and the n-type $Al_{x5}Ga_{1-x5}As$ first clad layer 502 of the window region located in the vicinity of the resonator end surface of the semiconductor laser element of the present embodiment. A Zn concentration distribution obtained after a first-time epitaxial growth and a Zn concentration distribution obtained after the RTA are shown. After the first-time epitaxial growth, there is little Zn diffusion from the p-type clad layer into the active layer. When the RTA is performed, the concentration of Zn diffused from the p-type clad to the active layer is $4 \times 10^{17}$ cm$^{-3}$ at a maximum.

Figure 12:
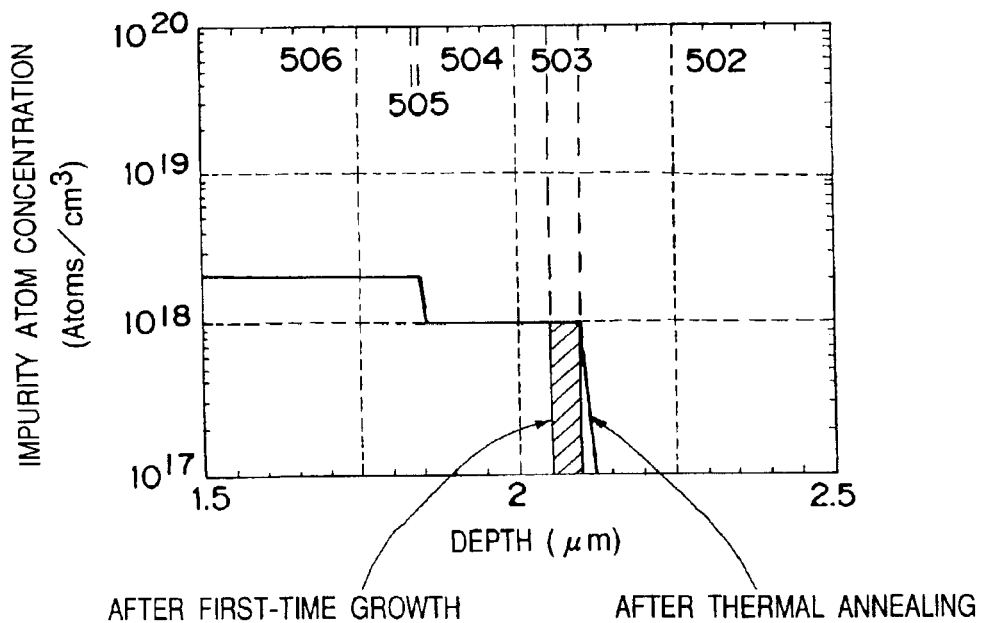
FIG. 12 is a graph of a p-type impurity atom concentration distribution in the internal region of the semiconductor laser element of the fifth embodiment of the present invention.

In contrast to this, FIG. 12 shows the impurity atom concentration distribution of the group-II atom (Zn) that is the p-type impurity in the p-type $Al_{x5}Ga_{1-x5}As$ third clad layer 506, the p-type GaAs etching stop layer 505, the p-type $Al_{x5}Ga_{1-x5}As$ second clad layer 504, the MQW active layer 503 and the n-type $Al_{x5}Ga_{1-x5}As$ first clad layer 502 in the resonator internal region of the semiconductor laser element of the present embodiment. A Zn concentration distribution obtained after the first-time epitaxial growth and a Zn concentration distribution obtained after the RTA are shown. After the first-time epitaxial growth, there is little Zn diffusion from the p-type clad layer into the active layer. When the RTA is performed, the concentration of Zn diffused from the p-type clad to the active layer is $10 \times 10^{17}$ cm$^{-3}$ at a maximum. As described above, the concentration of Zn diffused from the p-type clad layer to the active layer after the RTA is greater in the resonator internal region than in the window region located in the vicinity of the resonator end surface.

The fabricating method of the semiconductor laser element of the fifth embodiment of the present invention will be described with reference to FIGS. 10A through 10I. The n-type $Al_{x5}Ga_{1-x5}As$ first clad layer 502, the non-doped MQW active layer 503, the p-type $Al_{x5}Ga_{1-x5}As$ second clad layer 504, the p-type GaAs etching stop layer 505, the p-type $Al_{x5}Ga_{1-x5}As$ third clad layer 506 and the p-type GaAs protection layer 507 are successively epitaxially grown on the n-type GaAs substrate 501 by a first-time metal-organic chemical vapor deposition (MOCVD) method, obtaining a DH wafer (FIG. 10A).

An $SiO_{z5}$ dielectric film (z5 is a real number close to two, and its thickness is 0.7 $\mu$m) 521 is formed in a stripe shape of a width of 40 $\mu$m in a direction perpendicular to the ridge stripe by the plasma CVD method and the photolithographic method on the surface of the p-type GaAs protection layer 507 in the region located in the vicinity of the resonator end surface. The pitch of the stripe was set to about 800 $\mu$m equal to the resonator length (FIG. 10B).

Next, ionized atoms 522 are applied (ion irradiation) to the wafer surface that belongs to the resonator internal region and is located on the p-type GaAs protection layer 507 side. According to the fifth embodiment, argon (Ar) ion gas was used, and the ion irradiation energy was conditioned to be set to 1200 eV. An ion injection system was used for the ion irradiation (FIG. 10C).

The p-type GaAs protection layer 507 that was located in the resonator internal region and not covered with the $SiO_{z5}$ film 521 was etched by 0.2 $\mu$m. An $SiN_{t3}$ film 523 (t3 is a real number close to 4/3, and its thickness is 0.3 $\mu$m) is formed by the plasma CVD method on the surface of the $SiO_{z5}$ film 521 in the region located in the vicinity of the resonator end surface and on the surface of the p-type GaAs protection layer 507 that belongs to the resonator internal region and has undergone ion irradiation (FIG. 10D).

Next, a window region 513 in which the bandgap of the MQW active layer located just below the $SiO_{z5}$ film 521 is larger than the bandgap of the MQW active layer located in the resonator internal region is formed by the heat treatment according to the RTA method. With regard to heat treatment conditions at this time, the temperature was raised from the room temperature to a temperature of 950° C. in 20 seconds and retained for 90 seconds. As a result, the window region 513 and the internal region 514 were formed in the direction of the resonator in the active layer 503 (FIG. 10E).

In the window region located in the vicinity of the resonator end surface, the $SiO_{z5}$ film 521 absorbs a larger amount of Ga atoms of the p-type GaAs protection layer 507 than the $SiN_{t3}$ film 523 located in the resonator internal region during the heat treatment (thermal annealing). Therefore, a large amount of holes are generated in the region located in the vicinity of the resonator end surface, and the holes diffuse into the active layer. At this time, in contrast to the semiconductor laser elements of the first through fourth embodiments, the semiconductor laser element of the present embodiment has a higher hole density in the p-type layers of the second clad layer, the third clad layer and so on opposite to the window region. Therefore, the dopant (Zn) in the p-type clad layer is combined with the holes, and Zn enters the site of the holes. As a result, the Zn in the p-type clad layer is hard to diffuse to the window region side of the active layer (FIG. 11).

In contrast to this, in the p-type clad layer opposite to the internal region of the active layer, the generation of holes is restrained by the defect caused by the ion irradiation during the heat treatment (thermal annealing) similarly to the semiconductor laser element of the first through fourth embodiments. Therefore, a greater amount of dopant (Zn) in the p-type clad layer diffuse into the active layer (FIG. 12). As a result, the Zn concentration in the active layer becomes greater in the resonator internal region than in the window region located in the vicinity of the resonator end surface. As a result, the resistance of the internal region of the active layer is reduced, and this allows the current to be more efficiently injected.

Next, the dielectric films 521 and 523 formed on the surface of the p-type GaAs protection layer 507 are removed, and a stripe-shaped resist mask 524 that extends in the [011] direction on the p-type GaAs protection layer 507 is formed by using the normal photolithographic technology. By using the normal etching technology, the p-type GaAs protection layer 507 and the p-type $Al_{x5}Ga_{1-x5}As$ third clad layer 506 are etched so as to reach the p-type etching stop layer 505 and processed into a stripe-shaped ridge 516 that has a width of 2.5 $\mu$m and extends in the [011] direction. At this time, the thickness of the layer including the p-type etching stop layer, the p-type GaAs protection layer 507 and the p-type $Al_{x5}Ga_{1-x5}As$ third clad layer 506 is thicker in the region located in the vicinity of the resonator end surface than in the resonator internal region. Therefore, the width of the ridge 516 becomes wider in the region located in the vicinity of the resonator end surface when the protection layer 507 and the clad layer 506 are etched by chemical etching (FIG. 10F).

Next, the stripe-shaped resist mask 524 formed on the p-type GaAs protection layer 507 is removed, and the side surfaces of the ridge 516 constructed of the p-type GaAs protection layer 507 and the p-type $Al_{x5}Ga_{1-x5}As$ third clad layer 506 are buried in an n-type $Al_{y5}Ga_{1-y5}As$ current block layer 508 and a p-type GaAs flattening layer 509 by a second-time MOCVD method (FIG. 10G).

At this time, the thickness of the p-type GaAs protection layer 507 located just above the window region 513 in the region located in the vicinity of the resonator end surface becomes thicker than the thickness of the p-type GaAs protection layer 507 inside the resonator. Then, a difference in level is generated on the surface of the p-type GaAs flattening layer 509. With the difference in level used as a mark, only the p-type GaAs flattening layer 509 located just above the window region is covered with a resist, and a resist mask 525 that has a resist opening above the ridge other than the above-mentioned portion is formed. By the normal etching technology, the n-type $Al_{y5}Ga_{1-y5}As$ current block layer 508 and the p-type GaAs flattening layer 509 located at the opening of the resist mask 525 are selectively removed (FIG. 10H).

The resist mask 525 formed on the p-type GaAs flattening layer 509 is removed, and a p-type GaAs contact layer 510 is formed by a third-time MOCVD method (FIG. 10I).

Finally, a p-electrode 511 is formed on the upper surface and an n-electrode 512 is formed on the lower surface. Subsequently, a scribe line is scribed in the current injection prevention layer of the width of 50 μm, i.e., at the approximate center of the window region and divided into a laser bar of the resonator length. $AlO_s$ coating is performed so that the resonator end surface having the window region comes to have a reflectance of 12%, and a multilayer film of $AlO_s$ and amorphous Si is coated so that the resonator end surface located on the other side comes to have a reflectance of 95%. By division into chips, an element that has a window region of about 25 μm and the current injection prevention layer in the light-emitting end surface portion of the resonator of a length of 800 μm is fabricated.

The characteristics of the semiconductor laser element of the fifth embodiment of the present invention were evaluated. As a result, an oscillation wavelength of 785 nm conforming to the setting was obtained with an optical output CW of 120 mW by the semiconductor laser element of the present invention. Furthermore, the element stably operated with an optical output CW of 150 mW for 10000 hours or more at an ambient temperature of 70° C., and no such deterioration that the operating current was increased in operation was observed.

In the semiconductor laser element of the fifth embodiment, the p-type impurity (Zn) concentration in the active layer is higher in the internal region than in the window region. The Zn diffused into the active layer enters the site of the holes in the active layer, and therefore, the occurrence of the crystal defect can be prevented. As a result, the deterioration of the internal region during electrification can be restrained. Moreover, when Zn diffuses into the active layer of the window region, light absorption is caused. Then, the light absorption is further restrained as the Zn in the active layer of the window region is reduced, and the reliability in high-power operation is improved. For the above reasons, the semiconductor laser of the present invention is excellent in long-term reliability when driven at high power.

According to the semiconductor laser element fabricating method of the fifth embodiment, the quantity of Zn diffused from the p-type clad layer into the active layer can be concurrently controlled in the window region and the internal region by adjusting the heat treatment conditions in forming the window structure. That is, the amount of holes generated in the window region can be controlled by the temperature rise speed of the heat treatment, and the Zn diffusion into the active layer can be controlled in accordance with the control. The quantity of Zn diffused into the internal region can be controlled by the retention time of the heat treatment. Therefore, the present fabricating method has the effect that it is excellent in controllability.

According to the above description of the present invention, the AlGaAs based material is grown on the substrate. However, besides it, the present invention can also be applied to a material that includes Ga in the clad layer, such as an AlGaInP based material on a GaAs substrate, an AlInGaAsP based material on an InP substrate or a GaAs substrate and group-III-V materials of an InGaAlN based material on a sapphire substrate, an Si substrate or an SiC substrate.

Furthermore, according to the present invention, the case of MOCVD has been described as the crystal growth method. However, besides it, the present invention can also be applied to the growth methods by means of MBE (molecular-beam epitaxy), ALE (atomic layer epitaxy) and LPE (liquid phase epitaxy).

Moreover, according to the present invention, there has been described the structure that employs the multiple quantum well for the active layer. However, besides it, the present invention can also be applied to a single quantum well and a growth layer in which the quantum well layer has a thickness of not greater than 20 nm. Moreover, there has been the description of an identical composition owned by the p-type clad layer and the n-type clad layer between them the active layer interposes. However, the present invention can also be applied to the case of different compositions or the case of each clad layer constructed of layers of a plurality of compositions.

Moreover, according to the present invention, there has been the description of the case of the window region provided only on one end surface. However, it is, of course, acceptable to provide the window regions on both the side end surfaces of the semiconductor laser element.

What is claimed is:

1. A semiconductor laser element comprising on a substrate at least a first conductive type first clad layer, an active layer, a second conductive type second clad layer, a current block layer having a stripe-shaped deficient portion that extends in a direction of a resonator, a second conductive type third clad layer buried in the stripe-shaped deficient portion of the current block layer and a second conductive type protection layer provided on the third clad layer, wherein the active layer is constructed of at least a window region adjacent to its one end surface and an internal region having a quantum well structure, a peak wavelength λw of photoluminescence from the window region of the active layer has a relation of:

$$\lambda w \leq \lambda i - 5 \text{ nm}$$

with respect to a peak wavelength λi of photoluminescence from the internal region of the active layer, and a half-width of the photoluminescence from the window region is narrower than a half-width of the photoluminescence from the internal region.

2. A semiconductor laser element comprising on a substrate at least a first conductive type first clad layer, an active layer, a second conductive type second clad layer, a current block layer having a stripe-shaped deficient portion that extends in a direction of a resonator, a second conductive type third clad layer buried in the stripe-shaped deficient portion of the current block layer, and a second conductive type protection layer provided on the third clad layer, wherein the active layer is constructed of at least a window region adjacent to its one end surface and an internal region having a quantum well structure, a portion opposite to the internal region is irradiated with an ionized atom from a surface of a layer arranged on the second conductive type second clad layer side and thereafter subjected to heat treatment, and a layer thickness of the second conductive type protection layer of the portion opposite to the window region is thicker than a layer thickness of the second conductive type protection layer of the portion opposite to the internal region.

3. A semiconductor laser element comprising on a substrate at least a first conductive type first clad layer, an active layer, a second conductive type second clad layer, a current block layer having a stripe-shaped deficient portion that extends in a direction of a resonator, a second conductive type third clad layer buried in the stripe-shaped deficient portion of the current block layer, and a second conductive type protection layer provided on the third clad layer, wherein the active layer is constructed of at least a window region adjacent to its one end surface and an internal region having a quantum well structure, a portion opposite to the internal region is irradiated with an ionized atom from a surface of a layer arranged on the second conductive type second clad layer side and thereafter subjected to heat treatment, and a length Lw that belongs to the window region and extends in the direction of the resonator is not smaller than 10 µm.

4. A semiconductor laser element comprising on a substrate at least a first conductive type first clad layer, an active layer, a second conductive type second clad layer, a current block layer having a stripe-shaped deficient portion that extends in a direction of a resonator, a second conductive type third clad layer buried in the stripe-shaped deficient portion of the current block layer, and a second conductive type protection layer provided on the third clad layer, wherein the active layer is constructed of at least a window region adjacent to its one end surface and an internal region having a quantum well structure, a portion opposite to the internal region is irradiated with an ionized atom from a surface of a layer arranged on the second conductive type second clad layer side and thereafter subjected to heat treatment, and a total value of a thickness of the quantum well layer that constitutes the quantum well structure is not greater than 40 nm.

5. A semiconductor laser element comprising on a substrate at least a first conductive type first clad layer, an active layer, a second conductive type second clad layer, a current block layer having a stripe-shaped deficient portion that extends in a direction of a resonator, a second conductive type third clad layer buried in the stripe-shaped deficient portion of the current block layer, and a second conductive type protection layer provided on the third clad layer, wherein the active layer is constructed of at least a window region adjacent to its one end surface and an internal region having a quantum well structure, a portion opposite to the internal region is irradiated with an ionized atom from a surface of a layer arranged on the second conductive type second clad layer side and thereafter subjected to heat treatment, and a first conductive type current injection prevention layer is provided in the portion opposite to the window region located on the second conductive type protection layer.

6. A semiconductor laser element as claimed in claim 5, wherein a length Lp that belongs the first conductive type current injection prevention layer and extends in the direction of the resonator has a relation of:

$$Lw \leq Lp$$

with respect to Lw.

7. A semiconductor laser element comprising on a substrate at least a first conductive type first clad layer, an active layer, a second conductive type second clad layer, a current block layer having a stripe-shaped deficient portion that extends in a direction of a resonator, a second conductive type third clad layer buried in the stripe-shaped deficient portion of the current block layer, and a second conductive type protection layer provided on the third clad layer, wherein the active layer is constructed of at least a window region adjacent to its one end surface and an internal region having a quantum well structure, a portion opposite to the internal region is irradiated with an ionized atom from a surface of a layer arranged on the second conductive type second clad layer side and thereafter subjected to heat treatment, and a width of a portion opposite to the window region of the stripe-shaped deficient portion is wider than a width of a portion opposite to the internal region.

* * * * *